US 8,289,749 B2

Oct. 16, 2012

(12) United States Patent
Chen et al.

(10) Patent No.: US 8,289,749 B2
(45) Date of Patent: Oct. 16, 2012

(54) SOFT FORMING REVERSIBLE RESISTIVITY-SWITCHING ELEMENT FOR BIPOLAR SWITCHING

(75) Inventors: Xiying Chen, San Jose, CA (US); Abhijit Bandyopadhyay, San Jose, CA (US); Brian Le, San Jose, CA (US); Roy Scheuerlein, Cupertino, CA (US); Li Xiao, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 371 days.

(21) Appl. No.: 12/642,191

(22) Filed: Dec. 18, 2009

(65) Prior Publication Data

US 2011/0085370 A1 Apr. 14, 2011

Related U.S. Application Data

(60) Provisional application No. 61/249,946, filed on Oct. 8, 2009.

(51) Int. Cl.
*G11C 11/00* (2006.01)

(52) U.S. Cl. ............... 365/148; 365/158; 365/189.011; 365/189.16

(58) Field of Classification Search ............ 365/148, 365/158, 189.011, 189.16
See application file for complete search history.

(56) References Cited

U.S. PATENT DOCUMENTS

| | | | |
|---|---|---|---|
| 5,243,226 A * | 9/1993 | Chan | 326/38 |
| 5,825,046 A | 10/1998 | Czubatyj et al. | |
| 6,473,332 B1 * | 10/2002 | Ignatiev et al. | 365/148 |
| 7,187,228 B1 * | 3/2007 | Jain et al. | 327/525 |
| 7,289,351 B1 | 10/2007 | Chen et al. | |
| 7,345,907 B2 * | 3/2008 | Scheuerlein | 365/148 |
| 7,369,431 B2 * | 5/2008 | Muraoka et al. | 365/163 |
| 7,382,647 B1 * | 6/2008 | Gopalakrishnan | 365/163 |

(Continued)

FOREIGN PATENT DOCUMENTS

WO 2007103220 A2 9/2007

(Continued)

OTHER PUBLICATIONS

International Search Report and Written Opinion of the International Searching Authority, dated Jan. 27, 2011, Patent Cooperation Treaty, PCT Application No. PCT/US2010/051666, filed Oct. 6, 2010.

(Continued)

*Primary Examiner* — Viet Q Nguyen
(74) *Attorney, Agent, or Firm* — Vierra Magen Marcus & DeNiro LLP

(57) ABSTRACT

A method and system for forming reversible resistivity-switching elements is described herein. Forming refers to reducing the resistance of the reversible resistivity-switching element, and is generally understood to refer to reducing the resistance for the first time. Prior to forming the reversible resistivity-switching element it may be in a high-resistance state. A first voltage is applied to "partially form" the reversible resistivity-switching element. The first voltage has a first polarity. Partially forming the reversible resistivity-switching element lowers the resistance of the reversible resistivity-switching element. A second voltage that has the opposite polarity as the first is then applied to the reversible resistivity-switching element. Application of the second voltage may further lower the resistance of the reversible resistivity-switching element. Therefore, the second voltage could be considered as completing the forming of the reversible resistivity-switching element.

30 Claims, 16 Drawing Sheets

U.S. PATENT DOCUMENTS

| | | | |
|---|---|---|---|
| 7,426,128 B2 * | 9/2008 | Scheuerlein | 365/63 |
| 7,463,506 B2 * | 12/2008 | Muraoka et al. | 365/148 |
| 7,463,546 B2 * | 12/2008 | Fasoli et al. | 365/230.06 |
| 7,499,304 B2 * | 3/2009 | Scheuerlein et al. | 365/148 |
| 7,668,001 B2 * | 2/2010 | Tajiri et al. | 365/148 |
| 7,701,748 B2 * | 4/2010 | Lee et al. | 365/148 |
| 7,791,923 B2 * | 9/2010 | Baek et al. | 365/148 |
| 7,826,248 B2 * | 11/2010 | Xi et al. | 365/148 |
| 7,957,203 B2 * | 6/2011 | Nagashima et al. | 365/189.04 |
| 7,960,224 B2 * | 6/2011 | Chien et al. | 438/199 |
| 7,974,117 B2 * | 7/2011 | Tan et al. | 365/148 |
| 8,049,305 B1 * | 11/2011 | Miller et al. | 257/537 |
| 8,053,364 B2 * | 11/2011 | French et al. | 438/674 |
| 8,062,918 B2 * | 11/2011 | Miller et al. | 438/45 |
| 8,188,466 B2 * | 5/2012 | Kawano et al. | 257/43 |
| 2006/0126380 A1 | 6/2006 | Osada et al. | |
| 2007/0008770 A1 | 1/2007 | Nagao et al. | |
| 2008/0123389 A1 | 5/2008 | Cho et al. | |
| 2008/0211011 A1 * | 9/2008 | Takashima et al. | 257/324 |
| 2009/0039336 A1 | 2/2009 | Terao et al. | |
| 2009/0059652 A1 | 3/2009 | Taguchi | |
| 2009/0109737 A1 | 4/2009 | Kostylev | |
| 2009/0147563 A1 | 6/2009 | Happ et al. | |
| 2011/0110144 A1 * | 5/2011 | Kawai et al. | 365/148 |
| 2011/0205782 A1 | 8/2011 | Costa et al. | |
| 2011/0280059 A1 * | 11/2011 | Xiao et al. | 365/148 |

FOREIGN PATENT DOCUMENTS

| | | |
|---|---|---|
| WO | 2009011221 A1 | 1/2009 |
| WO | 2009114200 A1 | 9/2009 |
| WO | 2009150608 A1 | 12/2009 |
| WO | 2010125805 A1 | 11/2010 |

OTHER PUBLICATIONS

Yang, et al., "The Mechanism of Electroforming of Metal oxide Memristive Switches", Nanotechnology, May 5, 2009, 9 pages, vol. 20, No. 21, IOP Publishing, United Kingdom.

Ha, et al., "Bipolar Switching Characteristics of Nonvolatile Memory Devices Based on Poly(3,4-ethylenedioxythiophene): poly(styrenesulfonate) thin film", Applied Physics Letters, Jul. 22, 2008, 3 pages, vol. 93, No. 3, American Institute of Physics (AIP), Melville, NY, USA.

Do, et al., "Al Electrode Dependent Transition to Bipolar Resistive Switching Characteristics in Pure TiO2 Films", Dec. 9, 2008, Journal of Applied Physics, 4 pages, vol. 104, No. 11, American Institute of Physics (AIP), New York, USA.

English Abstract of Foreign Patent Document WO2010125805, published Nov. 4, 2010, Applicant Panasonic Corp. [JP].

International Search Report and Written Opinion of the International Searching Authority dated Aug. 17, 2011, PCT Application No. PCT/US2011/025367 filed Feb. 18, 2011, 16 pages.

Akihito Sawa, "Resistive switching in transition metal oxides", materialstoday Jun. 2008, vol. 11, No. 6.

* cited by examiner

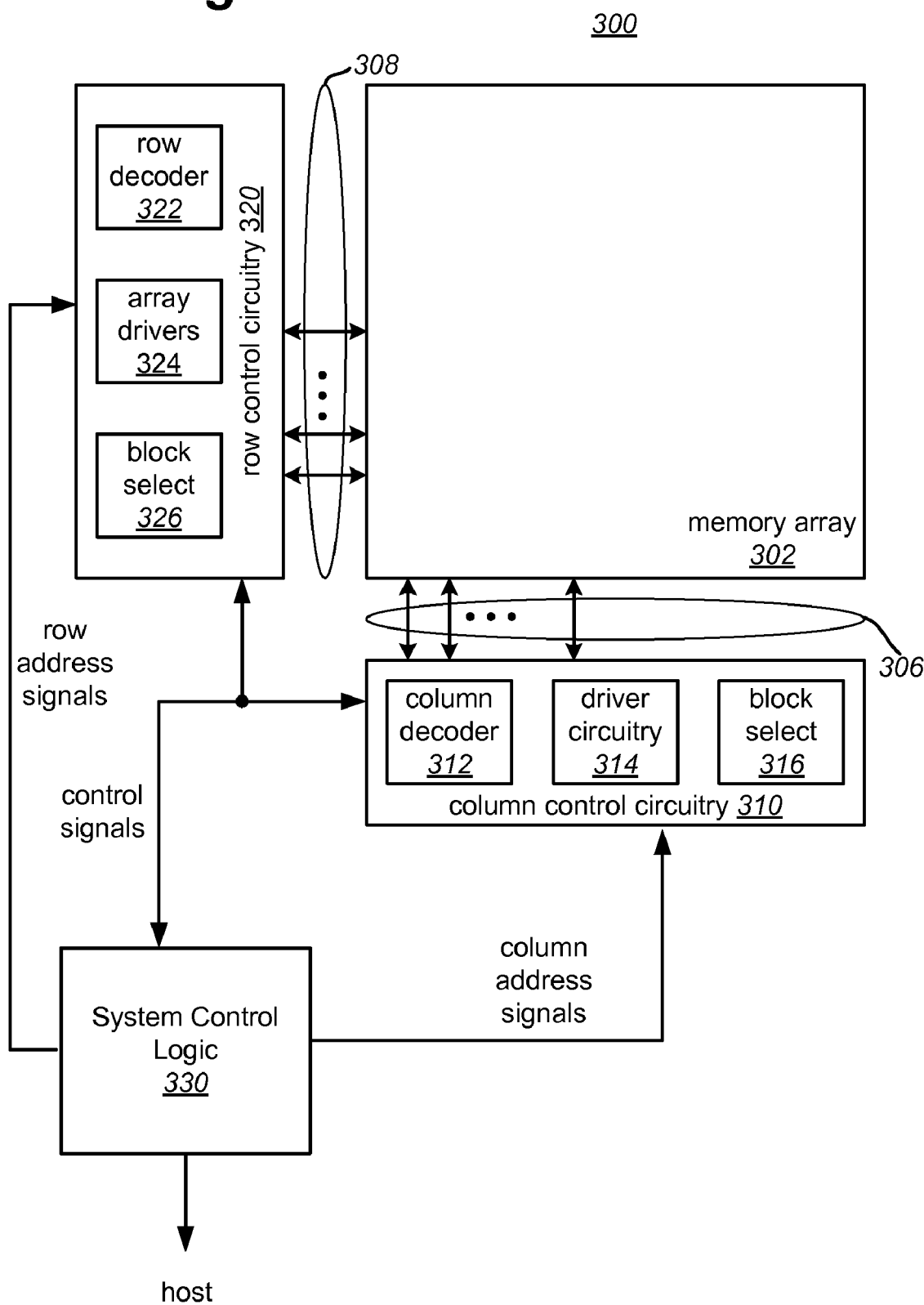

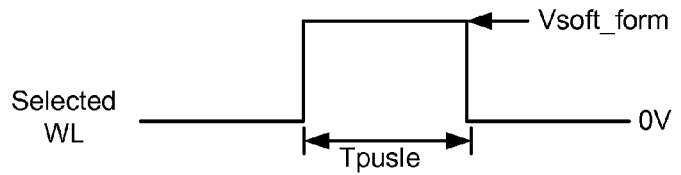
*Fig. 11A*
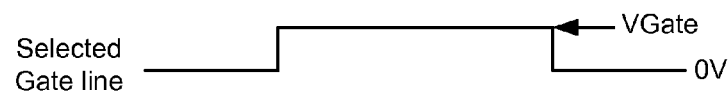
*Fig. 11B*
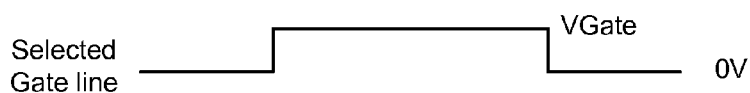
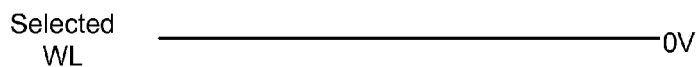
*Fig. 11C*
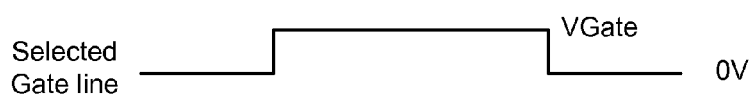

SOFT FORMING REVERSIBLE RESISTIVITY-SWITCHING ELEMENT FOR BIPOLAR SWITCHING

PRIORITY

This application claims the benefit of U.S. Provisional Application No. 61/249,946, entitled "Soft Forming Reversible Resistivity-Switching Element for Bipolar Switching," by Xiying Chen et al., filed on Oct. 8, 2009, incorporated herein by reference.

BACKGROUND

1. Field

This application relates to technology for data storage.

2. Description of the Related Art

A variety of materials show reversible resistivity-switching behavior, and as such may be suitable as use for memory elements. One type of material having reversible resistivity-switching behavior is referred to as resistance change memory (ReRAM). Transition metal oxides have been proposed for ReRAM. Upon application of sufficient voltage, current, or other stimulus, the reversible resistivity-switching material switches to a stable low-resistance state, which is sometimes referred to as SETTING the device. This resistivity-switching is reversible such that subsequent application of an appropriate voltage, current, or other stimulus can serve to return the reversible resistivity-switching material to a stable high-resistance state, which is sometimes referred to as RESETTING the device. This conversion can be repeated many times. The low resistance state is sometimes referred to as an "on" state. The high resistance state is sometimes referred to as an "off" state. For some switching materials, the initial state is low-resistance rather than high-resistance.

These switching materials are of interest for use in non-volatile memory arrays. One type of memory array is referred to as a cross-point array, which is a matrix of memory elements typically arranged along x-axes (e.g., word lines) and along y-axes (e.g., bit lines). A digital value may be stored as a memory resistance (high or low). The memory state of a memory cell can be read by supplying appropriate voltages to the bit line and word line connected to the selected memory element. The resistance or memory state can be read as an output voltage of the bit line connected to the selected memory cell. One resistance state may correspond to a data "0," for example, while the other resistance state corresponds to a data "1." Some switching materials may have more than two stable resistance states.

Non-volatile memories formed from reversible resistivity-switching elements are known. For example, U.S. Patent Application Publication 2006/0250836, filed May 9, 2005 and titled "REWRITEABLE MEMORY CELL COMPRISING A DIODE AND A RESISTIVITY-SWITCHING MATERIAL," which is hereby incorporated by reference herein in its entirety, describes a rewriteable non-volatile memory cell that includes a diode coupled in series with a reversible resistivity-switching material such as a metal oxide or metal nitride. The diode serves as a "steering element" to control which memory cells are programmed (e.g., SET or RESET) and read.

Two proposed modes of switching the memory cells between SET and RESET are unipolar and bipolar switching. In bipolar switching, the low resistance state is established by applying a voltage having one polarity and the high resistance state is established by applying a voltage having the opposite polarity. In unipolar switching, switching between the low resistance state and high resistance state is accomplished by applying voltages of the same polarity, although perhaps different magnitudes. For example, unipolar switching may depend on the amplitude of the applied voltage, but not the polarity. Note that with bipolar switching both the polarity and amplitude of the voltage may be different.

One theory that is used to explain the switching mechanism is that one or more conductive filaments are formed by the application of a voltage to the memory cell. The conductive filaments lower the resistance of the memory cell. Application of another voltage may rupture the conductive filaments, thereby increasing the resistance of the memory cell. Application of another still another voltage may repair the rupture in the conductive filaments, thereby decreasing the resistance of the memory cell once again.

The reversible resistivity-switching element may be in the high resistance state when it is first manufactured. The term "forming" is sometimes used to describe putting the reversible resistivity-switching element into a lower resistance state for the first time. Thus, the initial formation of the conductive filaments is sometimes referred to as "forming." The rupture of the filaments is sometimes referred to as RESETTING. The repair of the rupture of the filaments is sometimes referred to as SETTING. The formation of conductive filaments may be associated with either unipolar or bipolar switching. However, one theory explains unipolar switching as resulting from conductive filaments.

Another theory to explain switching behavior is that application of voltages alters the contact resistance at an interface between the reversible resistivity-switching element and an electrode. For example, application of a voltage of one polarity may decrease the contact resistance, whereas application of a voltage of the opposite polarity may increase the contact resistance. One theory to explain the change in contact resistance is electrochemical migration of oxygen vacancies to the interface. Another theory to explain the change in contact resistance is trapping of charge carriers at the interface (electrons or holes). It has been proposed that bipolar switching may occur, at least in part, due to changes in contact resistance.

As previously mentioned, the term "forming" is sometimes used to describe putting the reversible resistivity-switching element into a lower resistance state for the first time. Thus, the initial reduction of contact resistance may be referred to as "forming." Application of another signal which increases the contact resistance may be referred to as RESETTING. Application of still another signal which decreases the contact resistance again may be referred to as SETTING. Thus, note that both forming and SETTING refer to lowering the resistance of the reversible resistivity-switching element.

Note that switching behavior might be explained by other theories than those above. Thus, any of the reversible resistivity-switching elements described herein are not limited to the theories for switching behavior described herein. Also note that forming is generally used to describe the first time that the resistance is altered to a lower resistance state. However, forming is not necessarily limited to such an interpretation.

BRIEF DESCRIPTION OF THE DRAWINGS

FIG. 2 is a block diagram of one embodiment of a memory system.

FIG. 11A depicts signals that are applied to a selected word line, selected bit line and selected gate line when soft forming a memory element having an FET as a steering element.

FIG. 11B depicts signals that are applied to a selected word line, selected bit line and selected gate line when SETTING a memory element having an FET as a steering element.

FIG. 11C depicts signals that are applied to word lines and bit lines when sensing a memory element having an FET as a steering element.

DETAILED DESCRIPTION

Figure 1A:
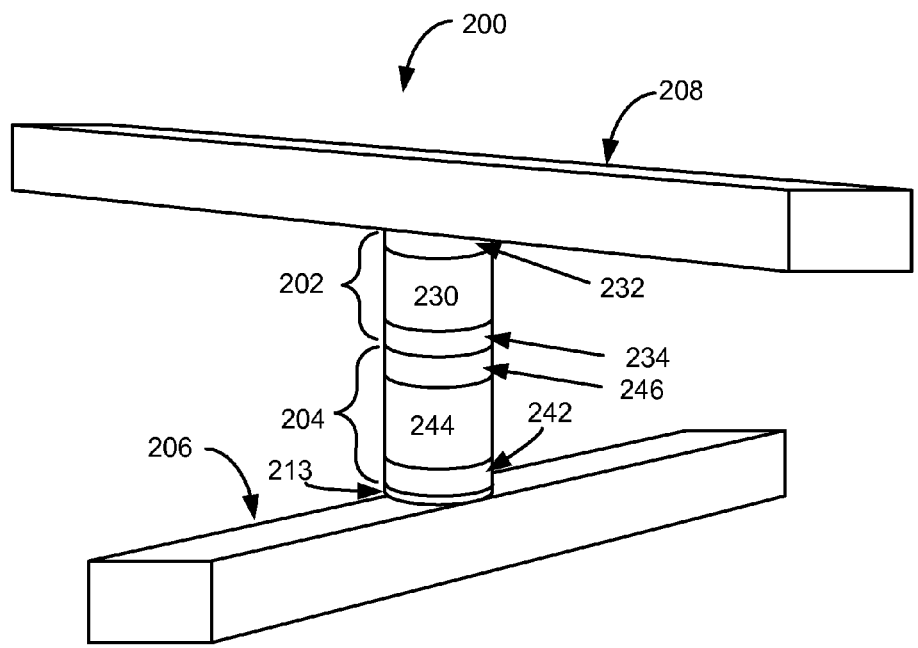
FIG. 1A is a simplified perspective view of one embodiment of a memory cell with a steering element.

A method and system for forming reversible resistivity-switching elements is described herein. Forming refers to reducing the resistance of the reversible resistivity-switching element, and is generally understood to refer to reducing the resistance for the first time. However, forming is not necessarily limited to the first time that the resistance is reduced.

One embodiment is a method for forming a reversible resistivity-switching element. In general, the method includes lowering the resistance of the reversible resistivity-switching element partway to a target resistance by applying a voltage having one polarity and then applying a voltage having the opposite polarity to further lower the resistance to the target resistance. Prior to forming the reversible resistivity-switching element it may be in a high-resistance state. Applying a first voltage "partially forms" the reversible resistivity-switching element. Partially forming the reversible resistivity-switching element means to lower the resistance of the reversible resistivity-switching element at least part way to a target resistance. However, the resistance is not necessarily lowered all the way to the target resistance. Applying a second voltage having the opposite polarity of the first voltage further lowers the resistance of the reversible resistivity-switching element to the target resistance. Therefore, the second voltage could be considered as completing the forming of the reversible resistivity-switching element.

At some later point, it may be desired to increase the resistance of the reversible resistivity-switching element (e.g., RESET). This may be in response to a request to store new data in the element. To RESET the reversible resistivity-switching element a third voltage which increases the resistance of the reversible resistivity-switching element is applied. The third voltage has the same polarity as the first voltage that was used to partially form the element.

In some embodiments, the first voltage forward biases a diode that is used as a steering element for the reversible resistivity-switching element and the second voltage reverse biases the steering diode. The process of partially lowering the resistance of the reversible resistivity-switching element by the application of the first voltage and then completing the formation with a voltage of the opposite polarity may reduce the chance of damage to the steering diode that might otherwise occur. For example, if the first voltage was not used to partially form the reversible resistivity-switching element, then the magnitude of the second voltage of the opposite polarity may need to be greater to complete the forming (e.g., the reach the target resistance) of the reversible resistivity-switching element. However, the diode could be damaged if too large of a voltage is applied to the diode. Also note that some diodes may be more susceptible to damage when under reverse bias. Therefore, for the cases in which the second voltage reverse biases the diode, the diode may be especially susceptible to damage.

Techniques disclosed herein for forming the memory element may achieve a significant window between the low resistance or "on" state and the high resistance state or "off" state. Having a large window between the low resistance and high resistance states may be desirable for reasons such as improvements in accuracy of determining the state in which the memory cell is in. Techniques disclosed herein are compatible with existing semiconductor fabrication process flows and may simplify such flows. For example, because the forming voltage that is used to reduce the resistance of the memory element is not required to be a high voltage, circuitry that is used to generate high voltages may not be needed. As an example, triple-well technology to develop high voltage CMOS in an isolated P-Well (IPW) may not be needed. Also, techniques disclosed herein may allow for less stringent requirements on the steering element diode. Further, techniques disclosed herein may improve power consumption due to the reduction of the reset current.

Memory Cell and System

Prior to discussing details of forming a memory cell, an example memory cell and system will be discussed. FIG. 1A is a simplified perspective view of one embodiment of a memory cell 200 which includes a reversible resistivity-switching element 202 coupled in series with a steering element 204 between a first conductor 206 and a second conductor 208. In some embodiments, the steering element 204 is a diode. In one embodiment, the diode steering element 204 is a p-i-n diode. In one embodiment, a p-i-n diode includes a p-doped region, an intrinsic region, and an n-doped region. In one embodiment, the diode steering element 204 is a punch-thru diode. A punch-thru diode used as a steering element may be may be a N+/P–/N+ device or a P+/N–/P+ device. In one embodiment, the diode steering element 204 is a Schottky diode. In one embodiment, the diode steering element 204 is a back-to-back Schottky diode. In some embodiments, diode 204 may be formed from a polycrystalline semiconductor material such as polysilicon, germanium, or another semiconductor. Also, the diode steering element 204 may comprise more than one type of semiconductor. For example, diode 204 may be formed from a polycrystalline silicon-germanium alloy, polygermanium or any other suitable combination of semiconductors. In some embodiments, each region 242, 244, 246 of the diode steering element 204 is formed from the same material (but doped differently). However, it is not required that each region be formed from the same material. For example, a heterostructure may be possible.

However, the steering element 204 is not limited to being a diode. In one embodiment, the steering element 204 is a transistor. For example, a Field Effect Transistor (FET) can be used for the steering element 204. FIG. 1E, which will be discussed later, depicts a schematic of a part of a memory array in which the steering element 204 is an FET.

The memory cell 200 has a memory element 202 that includes a reversible resistivity-switching material 230, an upper electrode 232, and a lower electrode 234. Electrode 232 is positioned between reversible resistivity-switching material 230 and conductor 208. In one embodiment, electrode 232 is made of TiN. Electrode 234 is positioned between reversible resistivity-switching material 230 and steering element 204. In one embodiment, electrode 234 is made of Titanium Nitride, and may serve as a barrier layer.

The memory cell 200 has an electrode 213 at the bottom of the memory cell 200 to facilitate electrical contact between the steering element 204 and other circuit elements. In one embodiment, electrode 213 is formed from TiN. Note that the relative positions of the steering element 204 and the memory element 202 could be reversed. For example, the steering element 204 could be above the memory element 202.

Reversible resistivity-switching element 202 includes reversible resistivity-switching material 230 having a resistance that may be reversibly switched between two or more states. For example, the reversible resistivity-switching material may be in an initial high-resistance state upon fabrication that is switchable to a low-resistance state upon application of a first physical signal. For example, the reversible resistivity-switching element 202 may switch states in response to application of a first amount of energy, charge, heat, voltage, current or other phenomena. Application of a second amount of energy, charge, heat, voltage, current or other phenomena may return the reversible resistivity-switching material to the high-resistance state. Alternatively, the reversible resistivity-switching element may be in an initial low-resistance state upon fabrication that is reversibly switchable to a high-resistance state upon application of the appropriate energy, charge, heat, voltage, current or other phenomena. When used in a memory cell, one resistance state may represent a binary "0" while another resistance state may represent a binary "1." However, more than two data/resistance states may be used. Numerous reversible resistivity-switching materials and operation of memory cells employing reversible resistivity-switching materials are described, for example, in U.S. Patent Application Publication 2006/0250836, previously incorporated.

In some embodiments, reversible resistivity-switching material 230 may be formed from a metal oxide. Various different metal oxides can be used. The metal-oxide may a transition metal-oxide. Examples of metal-oxides include, but are not limited to, NiO, $Nb_2O_5$, $TiO_2$, $HfO_2$, $Al_2O_3$, $MgO_x$, $CrO_2$, VO, BN, and AlN. In one embodiment, the memory element electrodes 232, 234 are formed from TiN. More information about fabricating a memory cell using reversible resistivity-switching material can be found in United States Patent Application Publication 2009/0001343, filed on Jun. 29, 2007, entitled "Memory Cell that Employs a Selectively Deposited Reversible Resistance Switching Element and Methods of Forming the Same," which is hereby incorporated herein by reference in its entirety.

Conductors 206 and 208 may include any suitable conductive material such as tungsten, any appropriate metal, heavily-doped semiconductor material, a conductive silicide, a conductive silicide-germanide, a conductive germanide, or the like. In the embodiment of FIG. 1A, conductors 206 and 208 are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with conductors 206 and 208 to improve device performance and/or aid in device fabrication.

While the reversible resistivity-switching element 202 is shown as being positioned above the steering element 204 in FIG. 1A, it will be understood that in alternative embodiments, the reversible resistivity-switching element 202 may be positioned below the steering element 204.

Figure 1B:
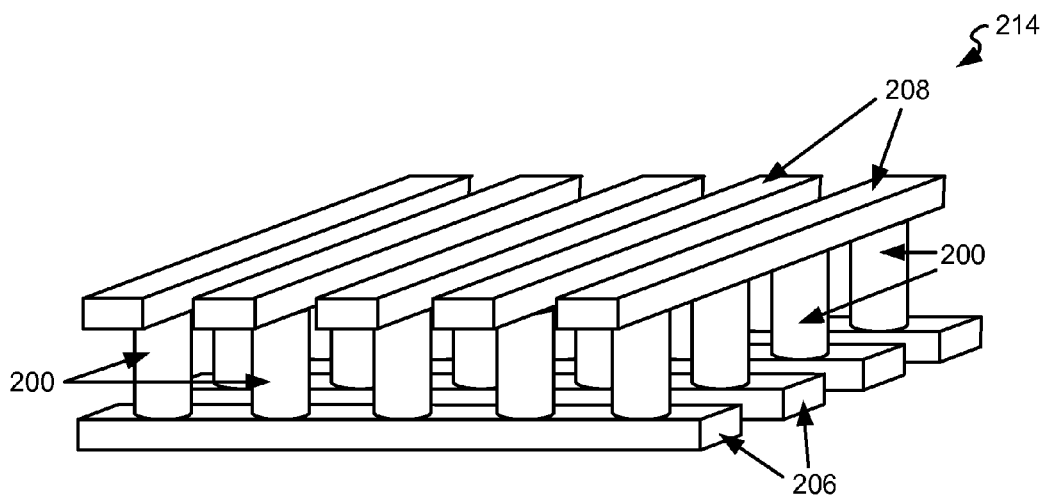
FIG. 1B is a simplified perspective view of a portion of a first memory level formed from a plurality of the memory cells of FIG. 1A.

FIG. 1B is a simplified perspective view of a portion of a first memory level 214 formed from a plurality of the memory cells 200 of FIG. 1A. For simplicity, the reversible resistivity-switching element 202 and the steering element 204 are not separately shown. The memory array 214 is a "cross-point" array including a plurality of first conductors 206 (e.g., bit lines) and a plurality of second conductors 208 (e.g., word lines) between which multiple memory cells are coupled (as shown). Other memory array configurations may be used, as may multiple levels of memory.

Figure 1C:
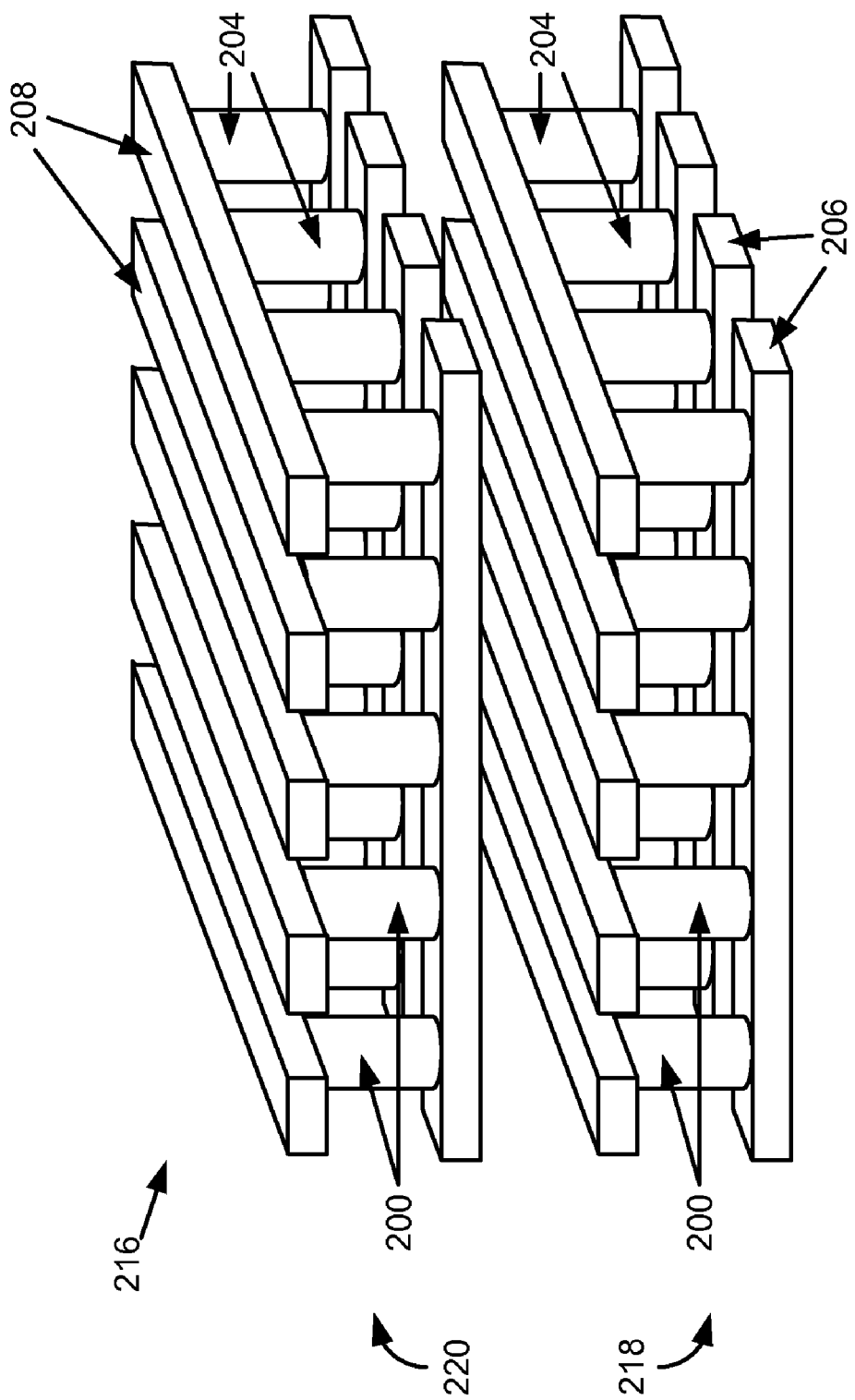
FIG. 1C is a simplified perspective view of a portion of a three dimensional memory array.

FIG. 1C is a simplified perspective view of a portion of a monolithic three dimensional array 216 that includes a first memory level 218 positioned below a second memory level 220. In the embodiment of FIG. 1C, each memory level 218 and 220 includes a plurality of memory cells 200 in a cross-point array. It will be understood that additional layers (e.g., an inter-level dielectric) may be present between the first and second memory levels 218 and 220, but are not shown in FIG. 1C for simplicity. Other memory array configurations may be used, as may additional levels of memory.

Figure 1D:
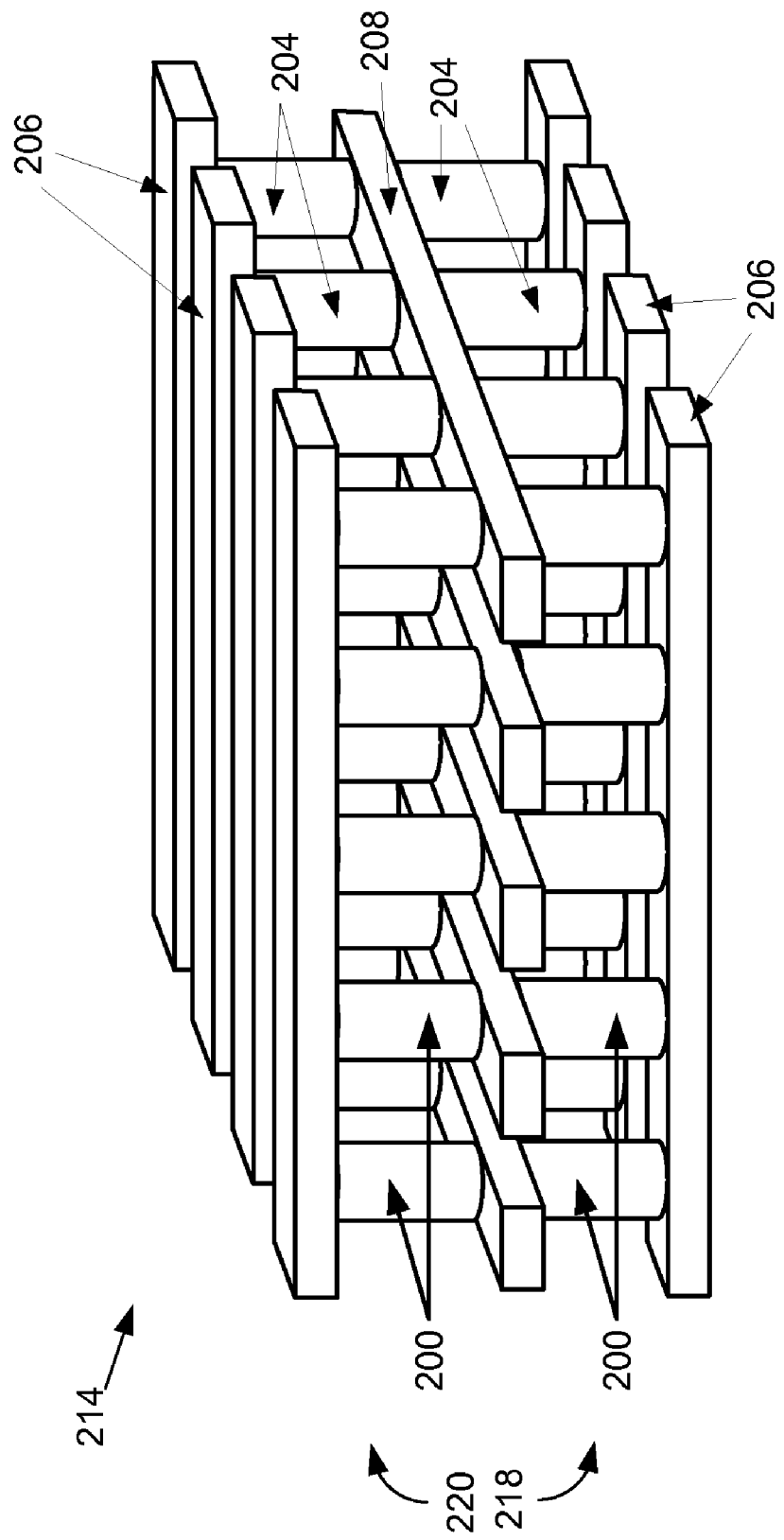
FIG. 1D is a simplified perspective view of a portion of a three dimensional memory array.
Figure 1E:
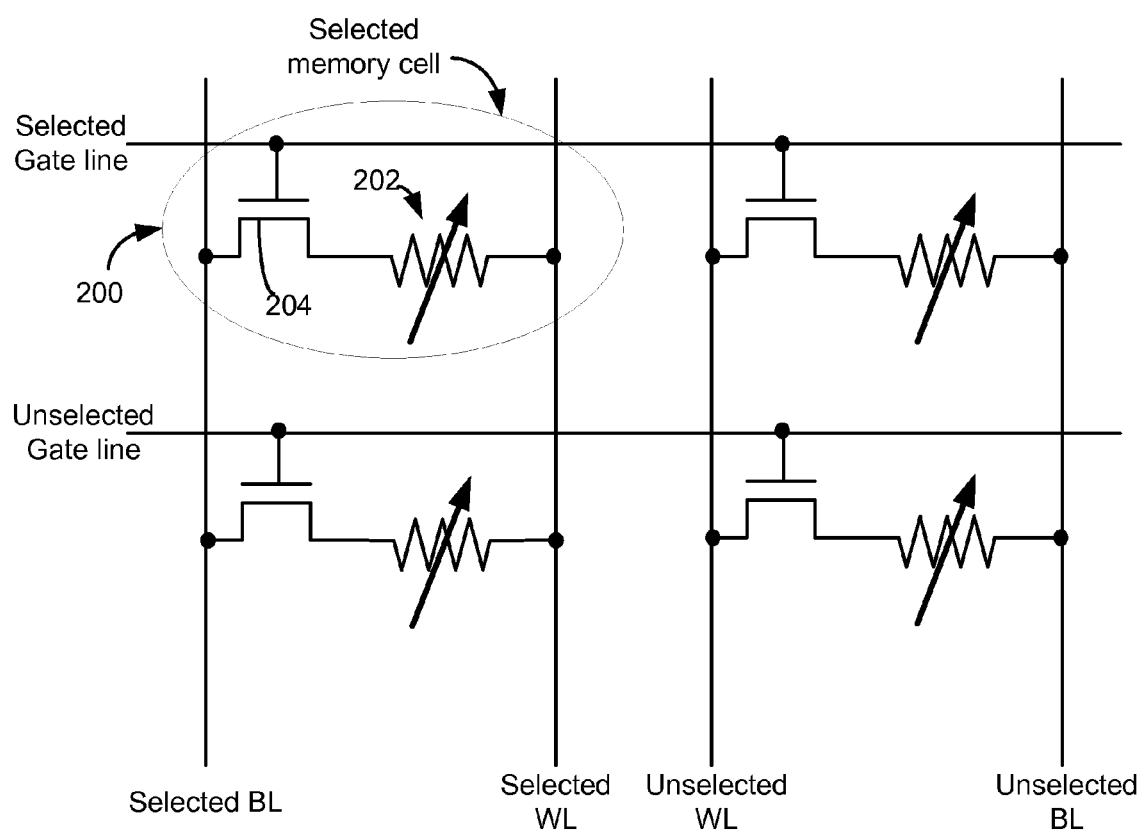
FIG. 1E depicts one embodiment of a portion of a memory array that uses FETs as steering elements.

In some embodiments, the memory levels may be formed as described in U.S. Pat. No. 6,952,030, "High-Density Three-Dimensional Memory Cell," which is hereby incorporated by reference herein in its entirety. For instance, the upper conductors of a first memory level may be used as the lower conductors of a second memory level that is positioned above the first memory level as shown in FIG. 1D.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory." The substrates may be thinned or removed from the memory levels before bonding, but as the memory levels are initially formed over separate substrates, such memories are not true monolithic three dimensional memory arrays.

FIGS. 1A-1D show memory cells in a cylindrical shape and conductors in the shapes of rails according to the disclosed arrangements. However, the technology described herein is not limited to any one specific structure for a memory cell. Other structures can also be used to form memory cells that include reversible resistivity-switching material. For example, the following patents provide examples of structures of memory cells that can be adapted to use reversible resistivity-switching material: U.S. Pat. Nos. 6,952,043; 6,951,780; 6,034,882; 6,420,215; 6,525,953; and U.S. Pat. No. 7,081,377.

As previously mentioned, the steering element 204 is not required to be a diode. FIG. 1E depicts one embodiment of a schematic of a portion of a memory array that uses FETs as steering elements 204. Each memory element 200 includes a reversible resistivity-switching element 202 and a steering element 204, which as stated is an FET. Each memory cell 200 resides between a bit line and a word line. The selected memory cell 200 resides between a selected word line and a selected bit line. The FET of the selected memory cell 200 is connected to the selected gate line. The voltage that is applied to the selected gate line controls the current that is allowed to flow through the reversible resistivity-switching element 202. For example, the gate voltage may be selected to limit the current through the reversible resistivity-switching element 202 to a desired level.

FIG. 2 is a block diagram that depicts one example of a memory system 300 that can implement the technology described herein. Memory system 300 includes a memory array 302 that can be a two or three dimensional array of memory cells as described above. In one embodiment, memory array 302 is a monolithic three dimensional memory array. The array terminal lines of memory array 302 include the various layer(s) of word lines organized as rows, and the various layer(s) of bit lines organized as columns. However, other orientations can also be implemented.

Memory system 300 includes row control circuitry 320, whose outputs 308 are connected to respective word lines of the memory array 302. Row control circuitry 320 receives a group of M row address signals and one or more various control signals from System Control Logic circuit 330, and typically may include such circuits as row decoders 322, array terminal drivers 324, and block select circuitry 326 for both read and programming (e.g., SET and RESET) operations. Memory system 300 also includes column control circuitry 310 whose input/outputs 306 are connected to respective bit lines of the memory array 302. Column control circuitry 306 receives a group of N column address signals and one or more various control signals from System Control Logic 330, and typically may include such circuits as column decoders 312, array terminal receivers or drivers 314, block select circuitry 316, as well as read/write circuitry, and I/O multiplexers. In one embodiment column decoder 312 is a reversible polarity decoder circuit. In one embodiment row decoder 322 is a reversible polarity decoder circuit. In one embodiment, a reversible polarity decoder circuit has active low output in one mode and active high output in another mode. Further details of reversible polarity decoder circuits are described in U.S. Pat. No. 7,542,370, filed on Dec. 31, 2006, which is hereby incorporated herein in its entirety.

System control logic 330 receives data and commands from a host and provides output data to the host. In other embodiments, system control logic 330 receives data and commands from a separate controller circuit and provides output data to that controller circuit, with the controller circuit communicating with the host. System control logic 330 may include one or more state machines, registers and other control logic for controlling the operation of memory system 300.

Integrated circuits incorporating a memory array usually subdivide the array into a number of sub-arrays or blocks. Blocks can be further grouped together into bays that contain, for example, 16, 32, or a different number of blocks. Each block in a 3-D memory may have many layers of memory cells. For example, a block might include 8 layers. Each layer may include hundreds, or thousands of bit lines and word lines. For example, a layer might have about a thousand bit lines and about 8 thousand word lines. In some implementations, there is a bit line driver associated with each bit line. Note that a given driver could be shared between two or more bit lines. Also note that it is not required that a given bit line have only one driver associated therewith. In some implementations, some of the drivers are physically located on one end of the bit lines and other drivers on the other end of the bit lines.

As frequently used, a sub-array is a contiguous group of memory cells having contiguous word and bit lines generally unbroken by decoders, drivers, sense amplifiers, and input/output circuits. This is done for any of a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. Nonetheless, for ease of description, an array may also be used synonymously with sub-array to refer to a contiguous group of memory cells having contiguous word and bit lines generally unbroken by decoders, drivers, sense amplifiers, and input/output circuits. An integrated circuit may include one or more than one memory array.

In one embodiment, all of the components depicted in FIG. 2 are arranged on a single integrated circuit. For example, system control logic 330, column control circuitry 310, and row control circuitry 320 are formed on the surface of a substrate and memory array 302 is a monolithic three dimensional memory array formed above the substrate (and, therefore, above system control logic 330, column control circuitry 310 and row control circuitry 320). In some cases, a portion of the control circuitry can be formed on the same layers as some of the memory array 302.

Figure 3:
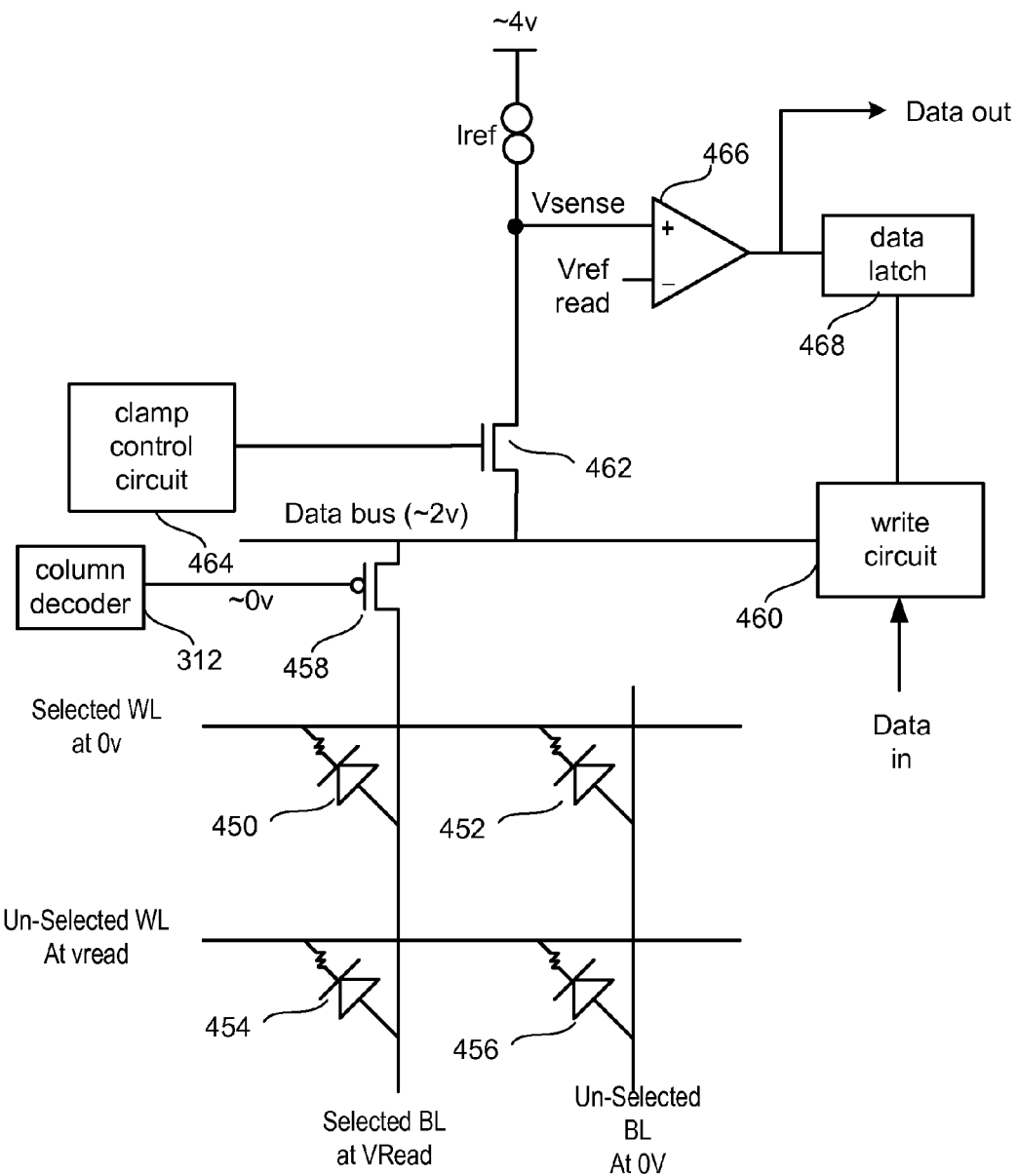
FIG. 3 depicts a circuit that can read the state of a memory cell.

FIG. 3 depicts a circuit that illustrates one embodiment for reading the state of a memory cell. To determine which state the reversible resistance-switching element 202 is in, a voltage may be applied and the resulting current is measured. A higher measured current indicates that the reversible resistance-switching element 202 is in the low-resistivity state. A lower measured current indicates that the reversible resistance-switching element 202 is in the high-resistivity state. FIG. 3 shows a portion of a memory array including memory cells 450, 452, 454 and 456, which may be based on the embodiments of FIGS. 1A, 1B, 1C, and 1D. In this example, the steering element 204 is a diode. Two of the many bit lines and two of the many word lines are depicted. A read circuit for one of the bit lines is depicted to be connected to the bit line via transistor 458, which is controlled by a gate voltage supplied by column decoder 312 in order to select or unselect the corresponding bit line. Transistor 458 connects the bit line to a Data bus. Write circuit 460 (which is part of system control logic 330) is connected to the Data bus. Transistor 462 connects to the Data bus and operates as a clamp device that is controlled by clamp control circuit 464 (which is part of system control logic 330). Transistor 462 is also connected to comparator 466 and reference current supply $I_{REF}$. The output of comparator 466 is connected to a data out terminal (to system control logic 330, a controller and/or a host) and to data latch 468. Write circuit 460 is also connected to data latch 468.

When attempting to read the state of the reversible resistivity-switching element, all word lines are first biased at Vread (e.g., approximately 2 volts) and all bit lines are at ground. The selected word line is then pulled to ground. For example purposes, this discussion will assume that memory cell 450 is selected for reading. One or more selected bit lines are pulled to Vread through the data bus (by turning on transistor 458) and the clamp device (transistor 462, which receives ~2 volts+Vt). The clamp device's gate is above Vread but controlled to keep the bit line near Vread. Current is pulled by the selected memory cell through transistor 462 from the $V_{SENSE}$ node. The $V_{SENSE}$ node also receives a reference current $I_{REF}$ that is between a high-resistance state current and a low-resistance state current. The $V_{SENSE}$ node moves corresponding to the current difference between the cell current and the reference current $I_{REF}$. Comparator 466 generates a data out signal by comparing the $V_{SENSE}$ voltage to a Vref-read voltage. If the memory cell current is larger than $I_{REF}$, the memory cell is in the low-resistance state and the voltage at $V_{SENSE}$ will be lower than $V_{REF}$. If the memory cell current is smaller than $I_{REF}$, the memory cell is in the high-resistance state and the voltage at $V_{SENSE}$ will be higher than $V_{REF}$. The data out signal from comparator 466 is latched in data latch 468. In some embodiments, the reference current is based on the address of the memory cell.

Figure 4:
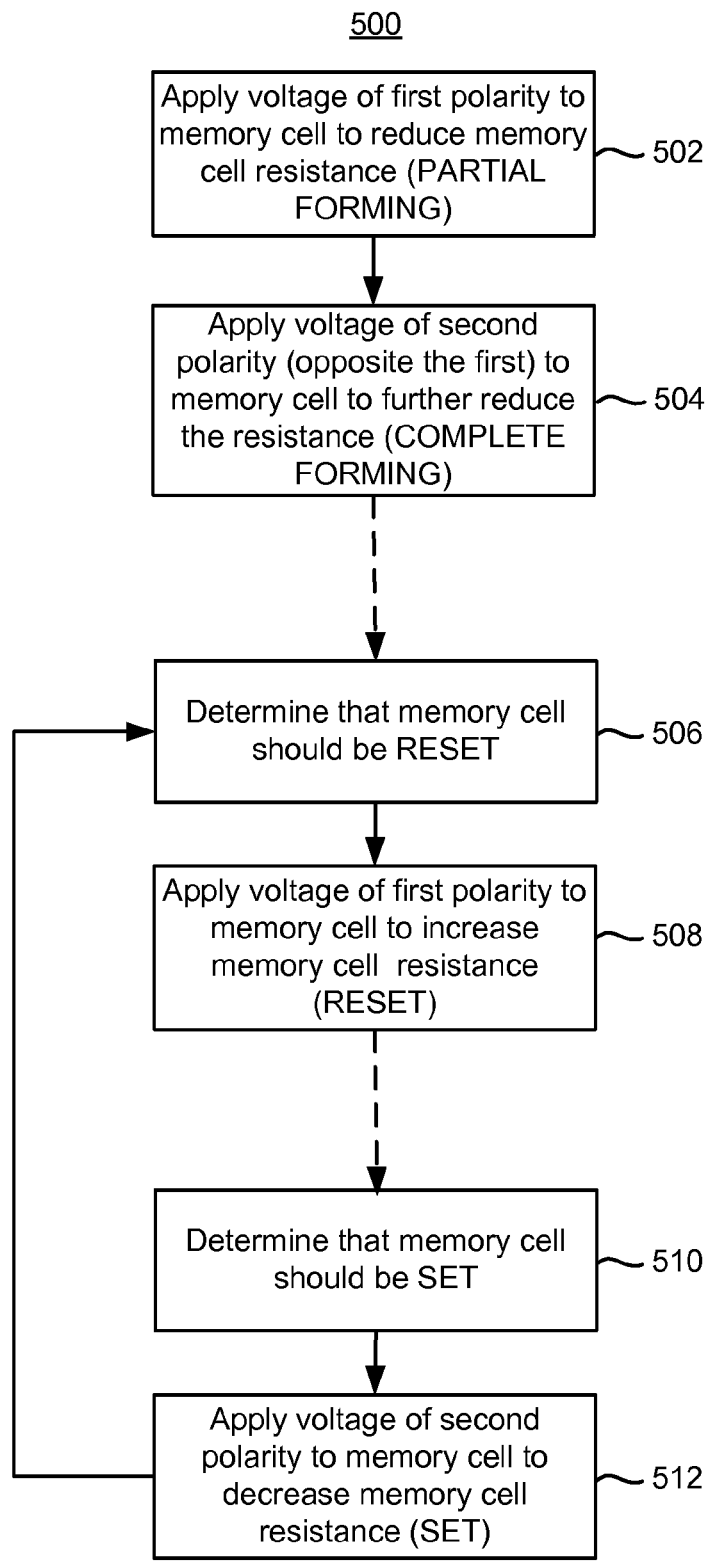
FIG. 4 depicts one embodiment of a process of forming, setting, and resetting a memory element.

FIG. 4 depicts one embodiment of a process 500 of operation of a memory array of memory cells 200 having reversible resistivity-switching elements 202. In process 500, bipolar switching is used. The memory cells 200 also have steering elements 204. The steering element 204 could be, but is not limited to, a diode, a p-i-n diode, a punch-thru diode, a Schottky diode, a back-to-back Schottky diode, or an FET. Process 500 may be initiated when a memory cell 200 is initially to be changed from the high resistance state to the low resistance state. In step 502, a first voltage is applied to a memory element 202 in order to partially form the memory element 202. The term "partially form" is used because application of another voltage will be used to complete the formation by further lowering the resistance of the memory element 202 to a target resistance. Applying the first voltage may also be referred to as "soft forming." As shown in some of the examples, the memory element 202 may be in series with a diode 204 that is used as a steering element. In some embodiments, the first voltage forward biases the diode 204. In some embodiments, the current through the memory element 202 is limited when applying the first voltage. Limiting the current may help to reduce the chance of damaging the diode.

In step 504, a second voltage is applied to the memory element 202 to further reduce the memory cell resistance to the target resistance. Step 504 results in completing the forming of the memory cell. The second voltage has the opposite polarity of the first voltage. For example, if the first voltage forward biased the diode 204, the second voltage reverse biases the diode 204. Note that it is not an absolute requirement that the first voltage forward biases the diode 204 and the second voltage reverse biases the diode 204. In some embodiments, the current through the memory element 202 is limited when applying the second voltage.

After step 504, the initial forming the memory cell 200 is complete. Note that because the resistance of the memory cell is low at this time, the memory cell may be considered to be SET at this time. A substantial time may pass before step 506 is performed, as indicated by the dashed arrow. In step 506, a determination is made that the memory cell should be RESET. This determination may be made in response to a request to store new data in the memory cell 200.

In step 508, a third voltage is applied to the memory element 202 in order to RESET the memory element 202. The third voltage has the same polarity as the first voltage used to partially form the memory element 202. In some embodiments, the third voltage forward biases the diode 204. In some embodiments, the current through the memory element 202 is limited when applying the third voltage. Note that RESETTING the memory element 202 may result in increasing the resistance of the memory element 202 as compared to the resistance after forming the memory element 202.

After step 508, a substantial time may pass before step 510 is performed, as indicated by the dashed arrow. In step 510, a determination is made that the memory cell should be SET. This determination may be made in response to a request to store new data in the memory cell 200. In step 512, the memory cell is SET by applying a voltage to the memory element 202 having the same polarity as the second voltage. Thus, the voltage used to SET the memory cell is the same polarity as the voltage used to complete the forming of the memory element 202 in step 504. In some embodiments, the voltage reverse biases the diode 204. Note that SETTING the memory element 202 may result in decreasing the resistance of the memory element 202 as compared to the resistance after RESETTING the memory element 202. The process 500 then continues to RESET and SET the memory cell 200 based on determinations that the state of the memory cell 200 should be changed. Note that RESET and SET are accomplished in process 500 with voltages having opposite polarity from each other. Therefore, process 500 uses bipolar switching of memory cells 200.

Figure 5A:
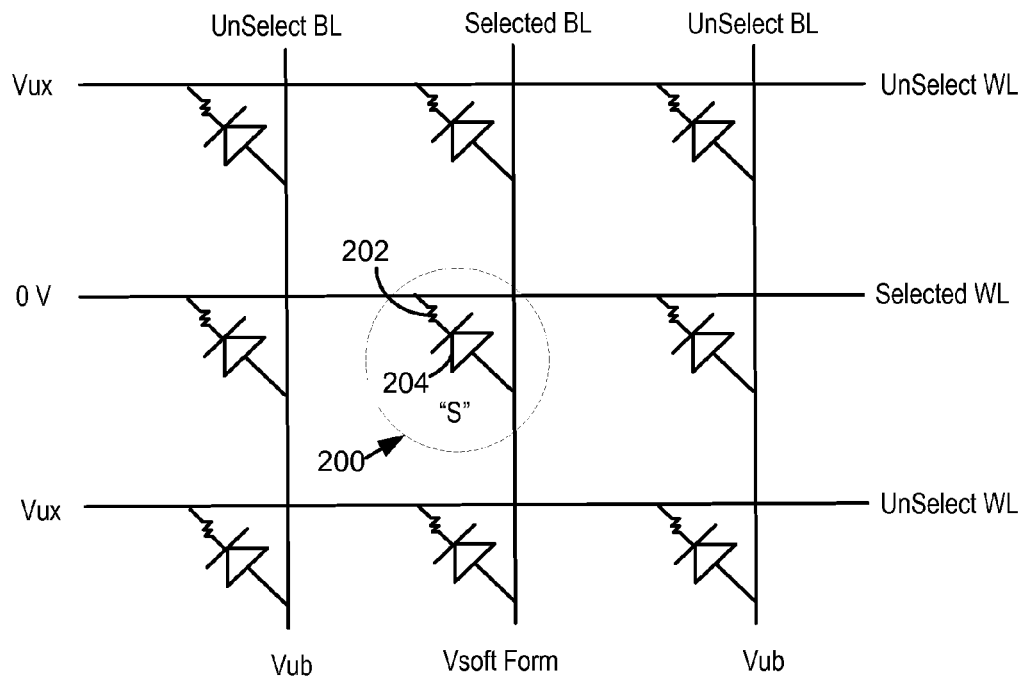
FIG. 5A, FIG. 5B, FIG. 5C, and FIG. 5D depict array biasing schemes.

FIG. 5A depicts one embodiment of an array biasing scheme for partially forming a memory cell 200 that has reversible resistivity switching element 202 and a diode 204 as a steering element. The example array biasing scheme may be used when implementing step 502 from process 500 in FIG. 4. In this example, the diode 204 of the selected memory cell 200 ("S") is forward biased. In this biasing scheme, Vsoft_form is applied to the selected bit line (BL) while the selected word line (WL) is grounded. As an example, Vsoft_form may be in the range from about 4.0V to about 6.0V. However, Vsoft_form could be higher or lower. Unselected word lines each have Vux applied thereto. In one embodiment, Vux is about Vsoft_form–0.7V. This results in about 0.7 V across unselected memory cells 200 that are along the selected bit line. Unselected bit lines each have Vub applied thereto. In one embodiment, Vub is about 0.7V. This results in about 0.7 V across unselected memory cells 200 that are along the selected word line. The diodes 202 of memory cells 200 along both an unselected word line and an unselected bit line may be reverse biased. In one embodiment, such memory cells 200 have about –(Vsoft_form–1.4 V) across them (from bit line to word line). Note that the voltages are presented as examples and that other voltages could be used.

Figure 5B:
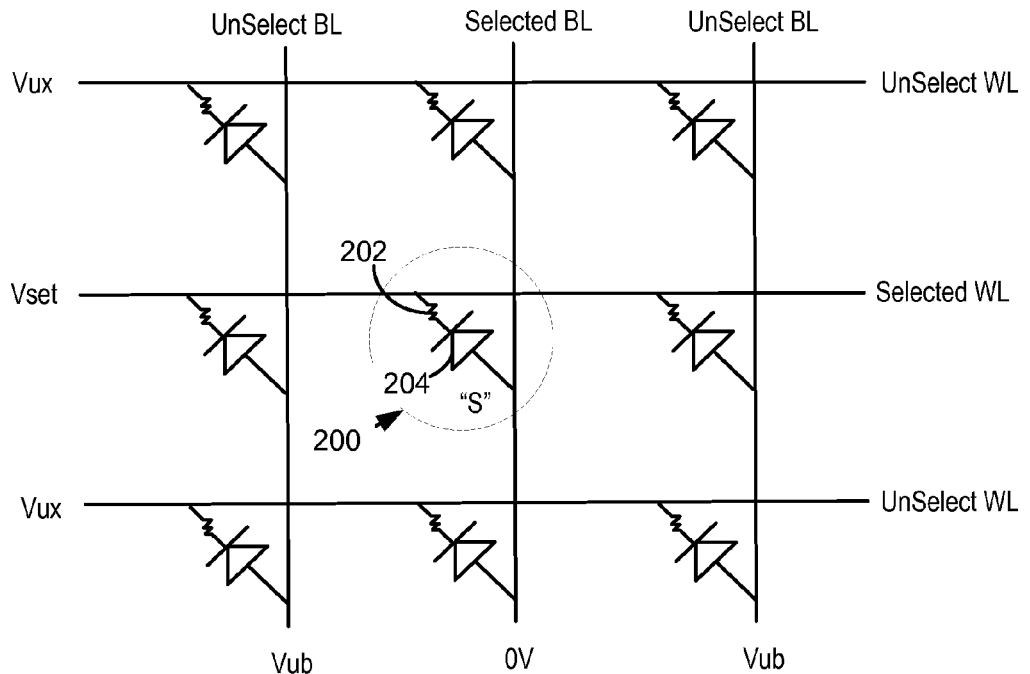

FIG. 5B depicts one embodiment of an array biasing scheme for SETTING a memory cell 200 that has reversible resistivity switching element 202 and a diode 204 as a steering element. The example array biasing scheme may be used to implement step 504 from process 500 in FIG. 4. The example array biasing scheme may also be used to implement step 512 from process 500 in FIG. 4. In this example, the diode 204 of the selected memory cell 200 is reverse biased. In this biasing scheme, Vset is applied to the selected word line (WL) while the selected bit line (BL) is grounded. As an example, Vset may be in the range from about 8.0V to about 9.0V. However, Vset could be higher or lower. However, note that by first performing the soft forming, the magnitude of Vset may be lower than if the soft forming were not performed. Using a lower magnitude of Vset may lower the chances that the diode 204 will be damaged. Unselected word lines each have Vux applied thereto. In one embodiment, Vux is about Vset/2. Unselected bit lines each have Vub applied thereto. In one embodiment, Vub is about Vset/2. Note that the magnitude of Vset could be different when completing the forming of the memory cell (e.g., step 504, FIG. 4), than when SETTING the memory cell (e.g., step 512, FIG. 4).

Figure 5C:
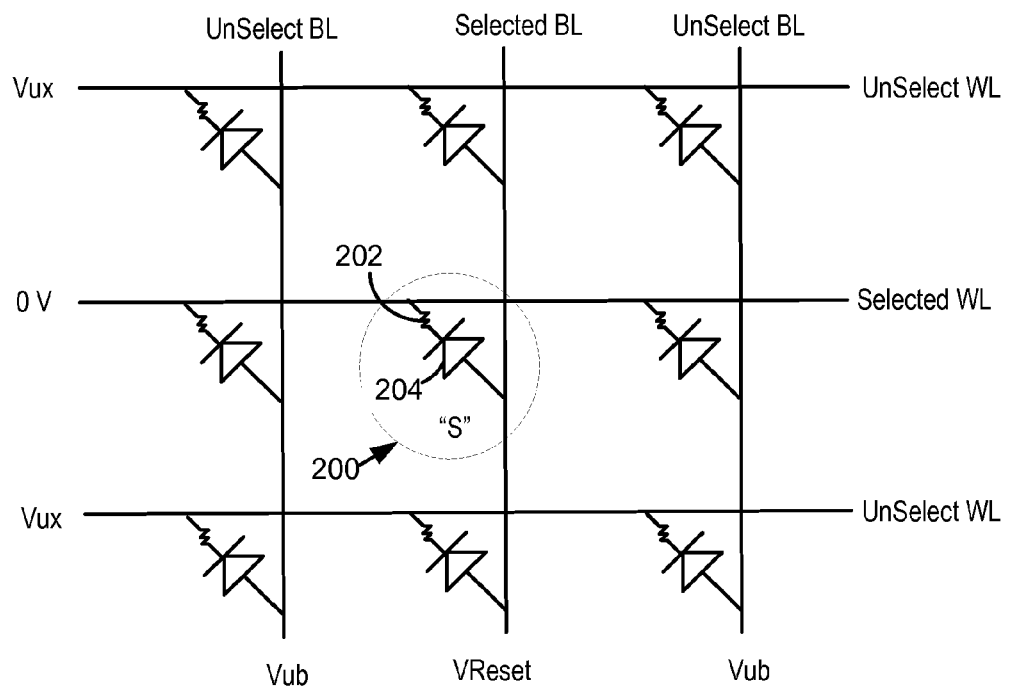

FIG. 5C depicts one embodiment of an array biasing scheme for RESETTING a memory cell 200 that has reversible resistivity switching element 202 and a diode 204 as a steering element. The example array biasing scheme may be used to implement step 506 from process 500 in FIG. 4. In this example, the diode 204 of the selected memory cell 200 ("S") is forward biased. In this biasing scheme, Vreset is applied to the selected bit line (BL) while the selected word line (WL) is grounded. As an example Vreset may be in the range from about 3.0V to about 5.0V. However, Vreset could be higher or lower. Unselected word lines each have Vux applied thereto. In one embodiment, Vux is about Vreset−0.7V. This results in about 0.7V across unselected memory cells 200 that are along the selected bit line. Unselected bit lines each have Vub applied thereto. In one embodiment, Vub is about 0.7V. This results in about 0.7V across unselected memory cells 200 that are along the selected word line. The diodes 202 of memory cells 200 along both an unselected word line and an unselected bit line may be reverse biased. In one embodiment, such memory cells 200 have about −(Vreset−1.4 V) across them (from bit line to word line). Note that the voltages are presented as examples and that other voltages could be used.

Figure 5D:
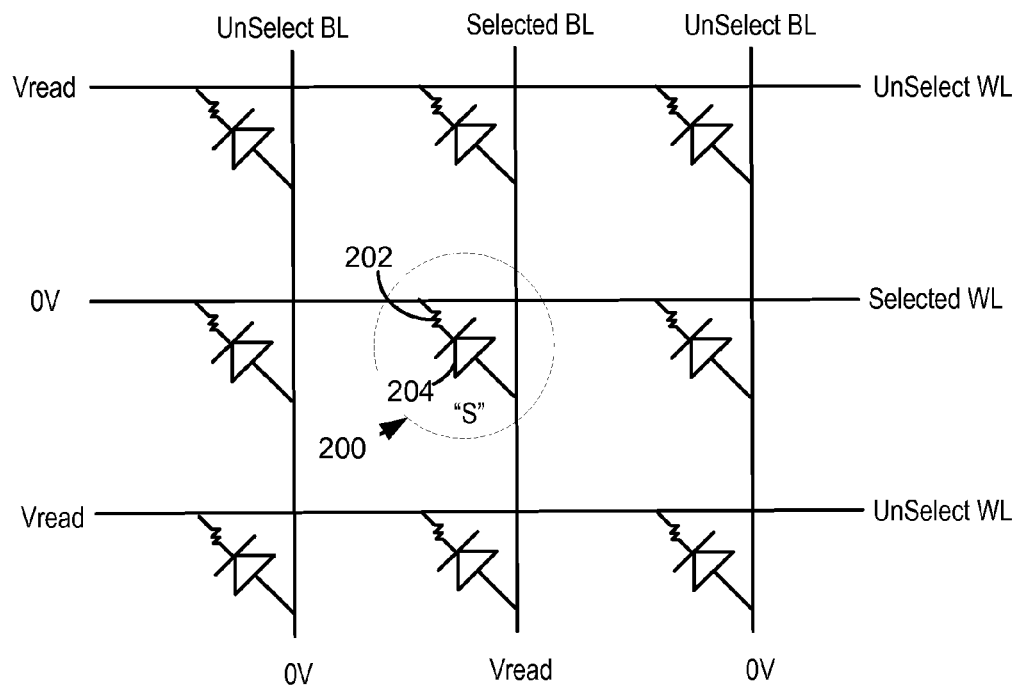

FIG. 5D depicts one embodiment of an array biasing scheme for reading a memory cell 200 that has reversible resistivity switching element 202 and a diode 204 as a steering element. In this example, the diode 204 of the selected memory cell 200 ("S") is forward biased when reading; however, forward biasing is not an absolute requirement. In this biasing scheme, Vread is applied to the selected bit line (BL) while the selected word line (WL) is grounded. As an example Vread may be about 2.0V. However, Vread could be higher or lower. Unselected word lines each have Vread applied thereto in this example. This results in about 0V across unselected memory cells 200 that are along the selected bit line. Unselected bit lines are grounded in this example. This results in about 0V across unselected memory cells 200 that are along the selected word line. The diodes 202 of memory cells 200 along both an unselected word line and an unselected bit line may be reverse biased. In one embodiment, such memory cells 200 have about −(Vread) across them (from bit line to word line).

Figure 6:
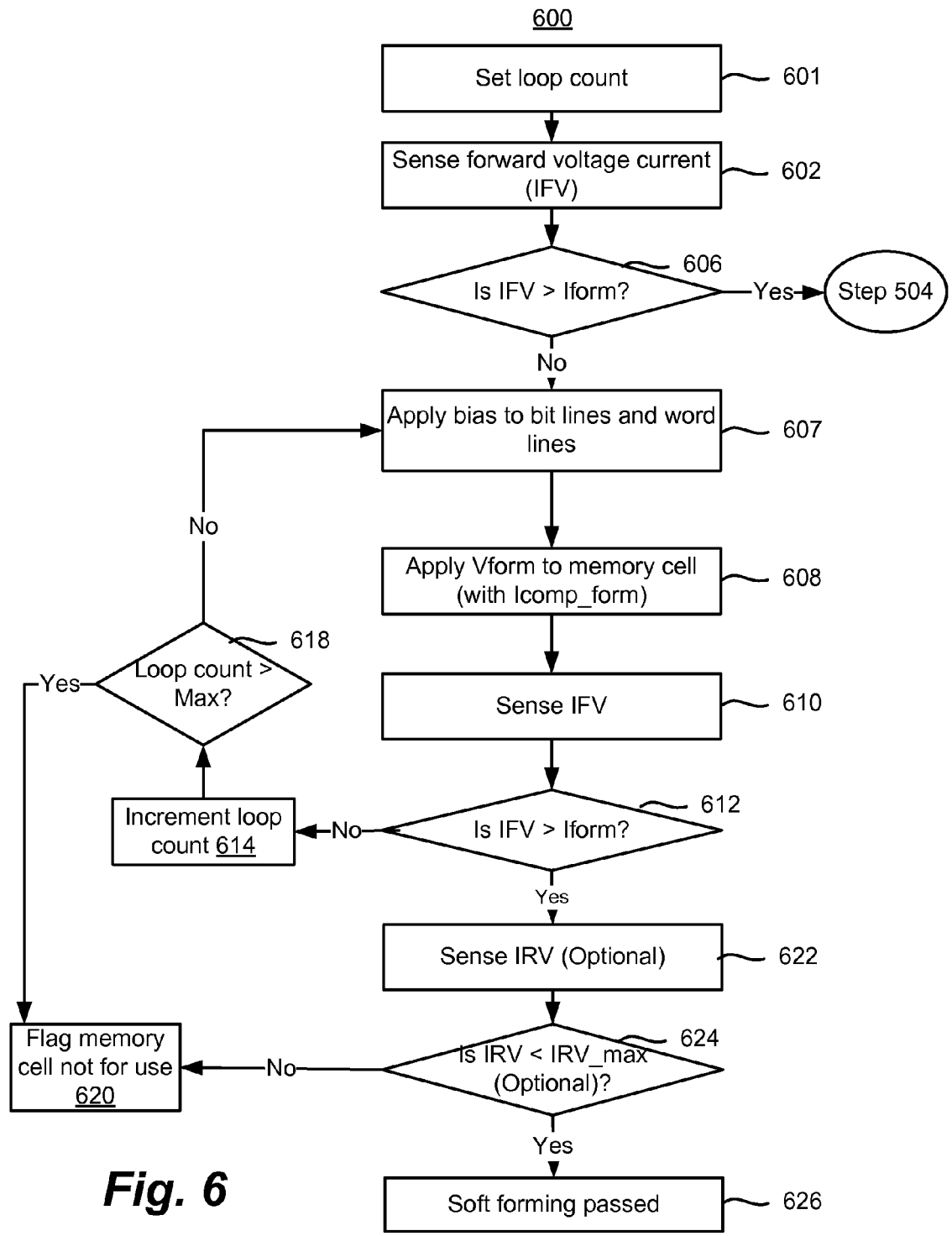
FIG. 6 is a flowchart illustrating one embodiment of a process of soft forming a memory element.

FIG. 6 is a flowchart illustrating one embodiment of a process 600 of partially forming a memory element 202. Process 600 is one implementation of step 502 of process 500 of FIG. 4. In step 601 a loop count is initialized to zero. The loop count is used to limit the number of times that partial forming is attempted. The maximum number of attempts may be established at any value including a single attempt.

In step 602, the memory cell 200 is read with a forward voltage to determine a forward voltage current (IFV) of the memory element 200. In embodiments in which the steering element is a diode, the diode 204 is forward biased. The example biasing scheme for reading memory cells of FIG. 5D may be used. For example, Vread is applied to the selected bit line while the selected word line is grounded. Vread may also be applied to unselected wordlines while unselected bit lines are grounded. An example of Vread is 2.0V. The circuit of FIG. 3 may be used to sense the forward bias current (IFV).

In step 606, the forward voltage current (IFV) is compared to a "soft form current." The soft form current is a value that indicates whether the resistance of the memory cell 200 is at a target resistance for a partially formed memory cell 200. The soft form current is typically a value that is less than the "on current," which may be referred to as "Ion." As previously discussed, SETTING the memory element 202 lowers its resistance, and hence increases the current for a given read voltage. The current Ion may be defined as a current that indicates that the resistance of the memory cell 200 is at a target value for being SET. Note that in some embodiments, the target resistance for SET is the same as the target resistance for a memory cell 200 that is completely formed, but that is not a requirement. Because the target resistance after partially forming the memory cell is higher than the target resistance for SET, Iform is typically lower than Ion.

If the forward current (IFV) is already greater than Iform, then it is not necessary to perform partial forming and the process goes to step 504 of FIG. 4. In other words, the resistance of the memory cell 200 is already at the target resistance for partial forming; therefore, it is not necessary to apply the voltage to partially form the memory cell. However, if the forward current (IFV) is less than Iform, then the process continues at step 607. In step 607, bias voltages are applied to bit lines and word lines. For example, Vux may be applied to word lines and Vub may be applied to bit lines In step 608, a "soft forming voltage" is applied to the memory element 202. For example, Vsoft_form may be applied to the selected bit line while the selected word line is grounded. An example range of the soft forming voltage is between about 4.5V to 7V. However, the soft forming voltage may be higher or lower. During soft forming, the current that is supplied to the memory element 202 may be limited to a current Icomp_form. In one embodiment, the biasing scheme depicted in FIG. 5A is used for steps 607-608. Additional details of timing of applying the bias voltages and soft forming voltage are discussed below in connection with FIG. 9.

In step 610, the forward current (IFV) is sensed again. In step 612, the forward current (IFV) is compared to the soft form current, Iform. If the forward current (IFV) is larger than the soft form current, Iform, then the soft forming was successful and the process continues at step 622. In other words, the resistance of the memory cell 200 has been reduced to at or below a target resistance for partial forming.

If it is determined in step 612 that the forward current (IFV) is smaller than the soft form current, Iform, then another attempt at soft forming may be attempted. At step 614, the loop count is incremented. If the loop count has not reached the maximum value (step 618), then the process goes to step 607 to apply the bias voltages to unselected bit lines and unselected word lines. Vform is applied to the memory cell again at step 608. Note that the value for Vform may be different than the previous application. For example, Vform could be increased or decreased.

If the loop count has reached the maximum at step 618, soft forming is aborted. The process goes to step 620 where the memory cell 200 is flagged such that it is not used. The process 600 then ends.

Assuming that step 612 determines that the forward current (IFV) is greater than Iform, the process continues at step 622. In step 622, the reverse current (IRV) is sensed. In step 622, the memory cell 200 is read with a reverse voltage to determine a reverse current (IRV) of the memory element 200. In embodiments in which the steering element is a diode, the diode 204 is reverse biased. For example, Vread is applied to the selected word line while the selected bit line is grounded. In one embodiment, Vread is applied to unselected word lines while the unselected bit lines are grounded. The circuit of FIG. 3 may be used to sense the reverse current (IRV).

In step 624, the reverse current (IRV) is compared to a maximum allowed reverse current, IRV_max. If the reverse current (IRV) is less than the maximum allowed reverse current IRV_max, then the soft forming is recorded as successful at step 626. The process 600 then ends. Note that steps 622 and 624 are optional. In some embodiments diode damage is limited or absent and is detected by other test steps or not at all.

On the other hand, if the reverse current (IRV) is larger than the maximum allowed reverse current, IRV_max, this may indicate that the diode 204 is damaged. The process goes to step 620 where the memory cell 200 is flagged such that it is not used. The process 600 then ends.

Note that the soft forming process may increase the forward current of the memory cell 200 substantially. For example, the forward current might be about 3 pico-amperes (pA) prior to soft forming (e.g., at step 602). However, after soft forming (e.g., after step 612 completes successfully) the forward current might be about 600 pA. Thus, the forward current may be increased by a factor of over 100. Note that the reverse current of the memory cell 200 may also increase as a result of soft forming. For example, the reverse current might be about 1 pA prior to soft forming and about 6 pA after soft forming.

Figure 7:
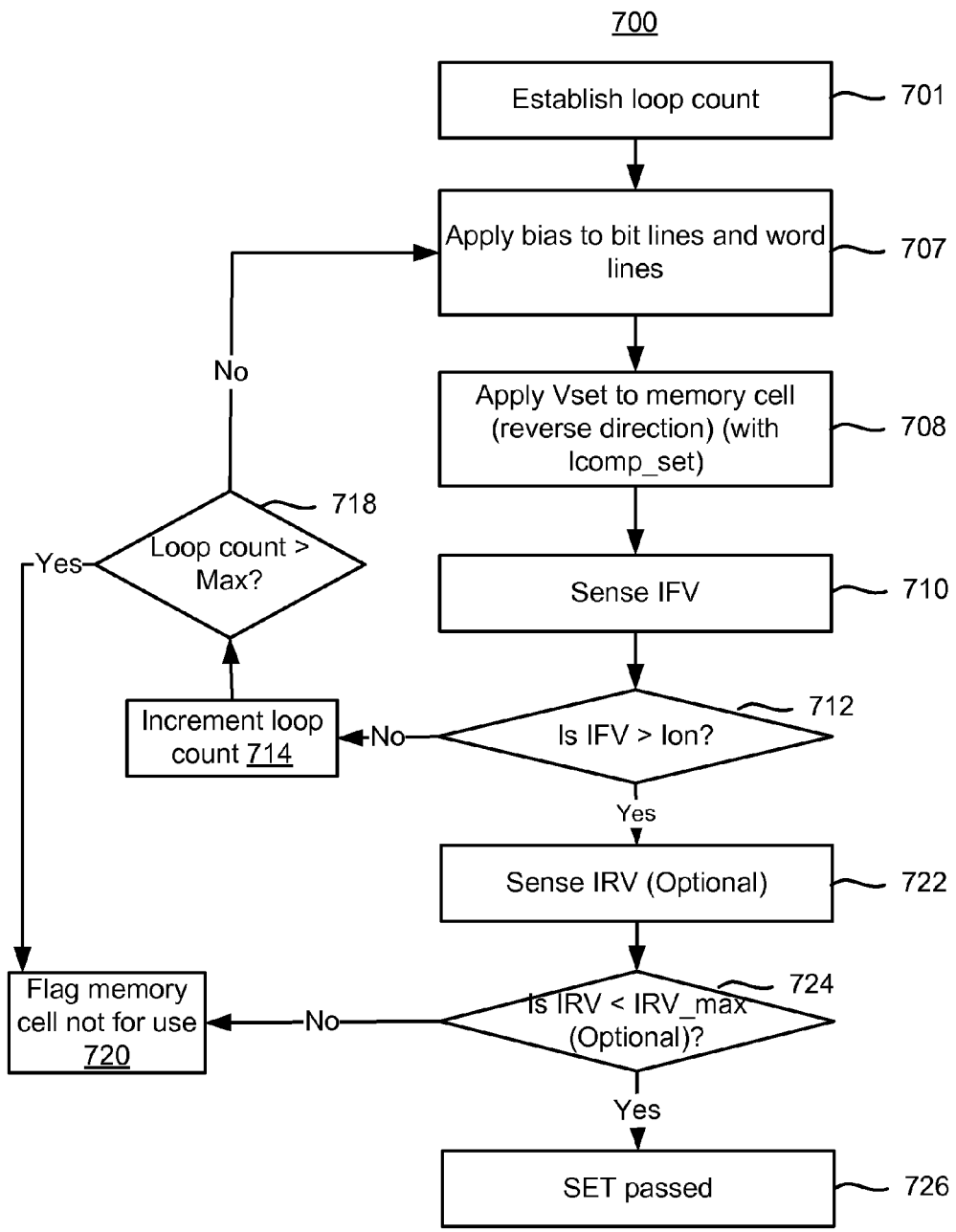
FIG. 7 is a flowchart illustrating one embodiment of a process of SETTING a memory element.

FIG. 7 is a flowchart illustrating one embodiment of a process 700 of completing the forming of a memory element 202. Process 700 is one implementation of step 504 of process 500 of FIG. 4. Thus process 700 may be performed after successful completion of soft or partial forming as depicted in FIG. 6. Note that process 700 may also be used to SET a memory cell 200. Thus, process 700 may also be used to implement step 512 of process 500. Note that completing the forming of the memory cell may be thought of as SETTING the memory cell. Therefore, process 700 will be discussed by referring to SETTING the memory cell. It will be understood that this may refer to either step 504 or 512 of process 500.

In step 701, a loop count is initialized to zero. The loop count is used to limit the number of times that SET is attempted. The maximum number of SET attempts may be established at any value including a single attempt.

In step 707, bias voltages are applied to bit lines and word lines. For example, Vux may be applied to word lines and Vub may be applied to bit lines. In one embodiment, step 707 includes raising the voltage to the word lines from ground to Vux and raising the voltage to the bit lines from ground to Vub. Note that the selected word line and the selected bit line may be treated the same as the unelected word lines and bit lines in step 707. In embodiments in which the steering element is a p-i-n diode, Vux may be about 5V and Vub may be about 5V. In embodiments in which the steering element is a punch-thru diode, Vux may be about 3V and Vub may be about 5V.

In step 708, a "SET" of the memory element 202 is attempted. In one embodiment, a SET voltage is applied to the memory element 202. In one embodiment, the biasing scheme depicted in FIG. 5B is used during step 708. For example, Vset may be applied to the selected word line while the selected bit line is grounded. An example range of the SET voltage is between about −7V to −10V (when viewed from the selected bit line to the selected word line). However, the SET voltage may be higher or lower. Note that the SET voltage is the opposite polarity as the soft forming voltage. During SET, the current that is supplied to the memory element 202 may be limited to a current Icomp_set. Additional details of timing of applying the voltages for steps 707-708 voltage are discussed below in connection with FIG. 10A.

In step 710, the forward current (IFV) is sensed. In one embodiment, sensing IFV includes biasing the array as depicted in FIG. 5D. However, other biasing schemes could be used.

In step 712, the forward current (IFV) is compared to an on current, Ion. As previously discussed, SETTING the memory cell 200 lowers the resistance, and hence increases the current for a given read voltage. The on current (Ion) may be defined as a current that indicates that the resistance of the memory cell 200 is at a sufficiently low value. If the forward current (IFV) is larger than the Ion, then resistance of the memory element 202 is sufficiently low and the process continues at step 722. In one implementation, the circuit of FIG. 3 is used to compare IFV with Ion. In this example, Iref is established as Ion. Transistor 462 supplies current IFV from the selected bit line. The output of comparator 466 indicates whether IFV is greater than Ion. As an example, the forward current (IFV) might increase to about 10 nano-amperes (nA) or 100 nA. Thus, the forward current may increase substantially from the forward current after soft forming.

If the forward current (IFV) is smaller than Ion, then additional attempts may be made to SET the memory cell. In step 714, the loop count is incremented. If the loop count is not at the maximum allowed number of attempts (step 718), then the process returns to step 707 to apply bias conditions to the unselected bit lines and unselected word lines. In step 708, the value of Vset may be increased, decreased, or kept the same as before.

However, if the maximum number of attempts to SET has been reached, then the SETTING is aborted. The process goes to step 720 where the memory cell 200 is flagged such that it is not used. The process then ends.

Assuming that step 712 determines that IFV is greater than Ion, the process continues at step 722. In step 722, the reverse current (IRV) is sensed. As an example, the reverse current (IRV) might increase to about 6-11 pA as a result of SETTING the memory cell 200. In step 724, the reverse current (IRV) is compared to a maximum allowed reverse current, IRV_max. If the reverse current (IRV) is less than the maximum allowed reverse current IRV_max, then the soft forming is recorded as successfully at step 726. The process then ends. Note that steps 722 and 724 are optional. In some embodiments diode damage is limited or absent and is detected by other test steps or not at all.

On the other hand, if the reverse current (IRV) is larger than the maximum allowed reverse current, IRV_max, this may indicate that the diode 204 is damaged. The process goes to step 720 where the memory cell 200 is flagged such that it is not used. The process then ends.

In process 700, if the memory cell was not SET after applying Vset, the process attempts to SET the memory cell again. In another embodiment, if the memory cell was not SET after applying Vset, another attempt is made to soft form the memory cell. For example, rather than going to step 707 if the loop count does not exceed the maximum number of SET attempts, the process goes to step 607 of process 600 of FIG. 6.

Figure 8:
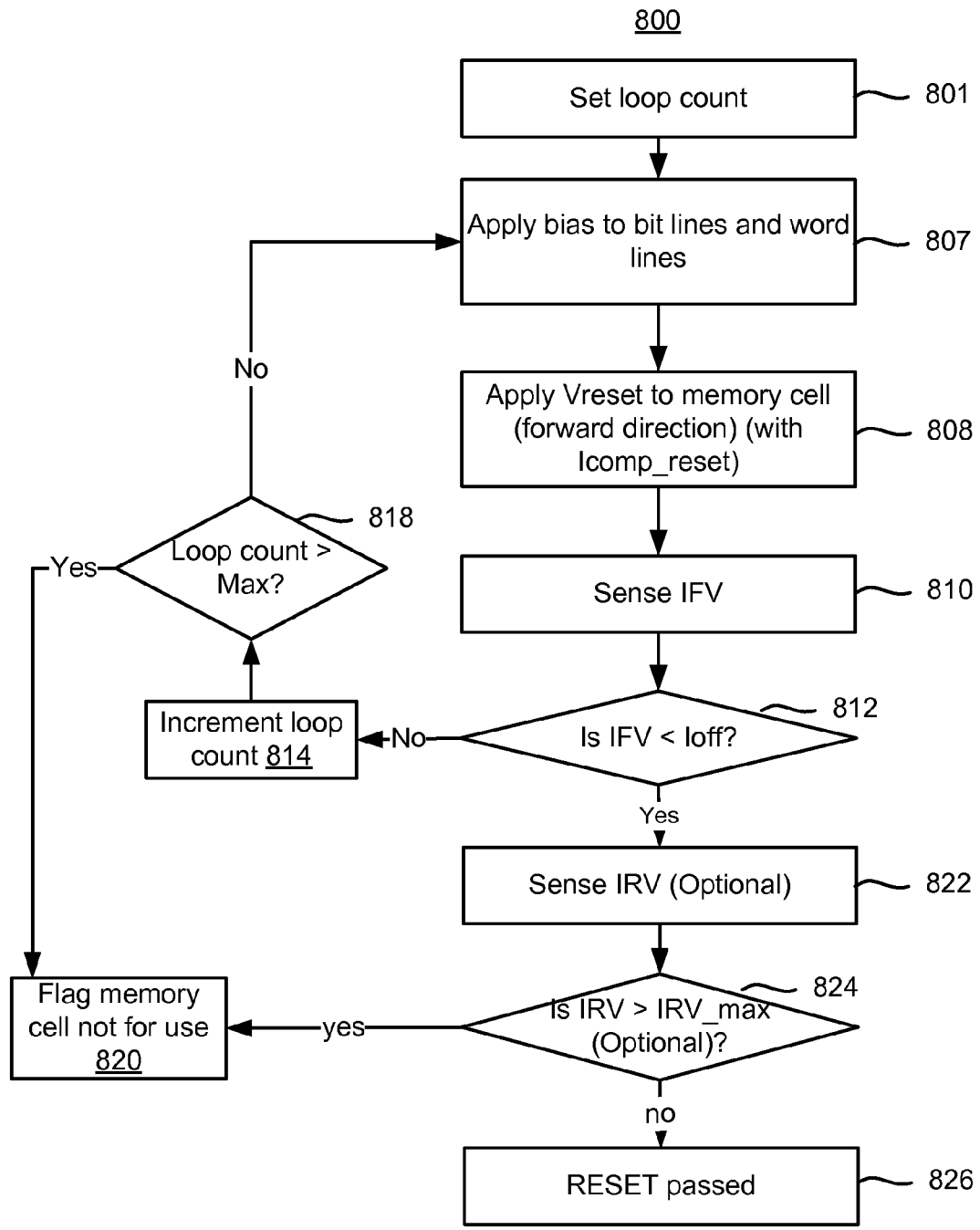
FIG. 8 is a flowchart illustrating one embodiment of a process of RESETTING a memory element.

FIG. 8 is a flowchart illustrating one embodiment of a process 800 of RESETTING a memory element 202. Process 800 is one implementation of step 508 of process 500 of FIG. 4. Thus, process 800 may be performed after a determination is made that a memory cell 200 should be RESET. In step 801, a loop count is initialized to zero. The loop count is used to limit the number of times that RESET is attempted. The maximum number of attempts may be established at any value including a single attempt.

In step 807, bias voltages are applied to unselected bit lines and unselected word lines. For example, Vux may be applied to word lines and Vub may be applied to bit lines.

In step 808, a "RESET" voltage is applied to the memory element 202. In one embodiment, a RESET voltage is applied to the selected bit line. In one embodiment, the biasing scheme depicted in FIG. 5C is used during the RESET step 808. For example, Vreset may be applied to the selected bit line while the selected word line is grounded. An example range of the RESET voltage is between about 2.0V to 3.5V. However, the RESET voltage may be higher or lower. Note that the RESET voltage may be the opposite polarity as the SET voltage. For example, the RESET voltage may have the opposite polarity of the voltage used in step 504 of FIG. 4 to complete the forming of the memory cell. Therefore, the RESET voltage may have the same polarity as the soft forming voltage used in step 502 of FIG. 4. During RESET, the current that is supplied to the memory element 202 may be limited to a current Icomp_reset. Additional details of timing of applying the bias voltages and RESET voltage of steps 807-808 are discussed below in connection with FIG. 10B.

In step 810, the forward current (IFV) is sensed. In step 812, the forward current (IFV) is compared to an off current (Ioff). As previously discussed, RESETTING the memory cell 200 increases the resistance, and hence decreases the current for a given read voltage. The off current (Ioff) may be defined as a current that indicates that the resistance of the memory cell 200 is at a sufficiently high value to be considered to be RESET. If the forward current (IFV) is less than the off current (Ioff), then resistance of the memory element 202 is sufficiently high and the process continues at step 822. As an example, RESETTING the memory cell 200 may reduce the forward current (IFV) to a value such as 40 nA.

If the forward current (IFV) is larger than Ioff, then additional attempts may be made to RESET the memory cell 200. In step 814, the loop count is incremented. If the loop count is not at the maximum allowed number of attempts (step 818), then the process returns to step 807 to apply bias conditions to the unselected bit lines and unselected word lines. In step 808, the value of Vreset may be increased, decreased, or kept the same as before.

However, if the maximum number of attempts to RESET has been reached, then the RESETTING is aborted. The process goes to step 820 where the memory cell 200 is flagged such that it is not used. The process then ends.

Assuming that it is determined in step 812 that the forward current (IFV) is less than Ioff, the process continues at step 822. In step 822, the reverse current (IRV) is sensed. As an example, the reverse current (IRV) might decrease to about 6 pA as a result of RESET. In step 824, the reverse current (IRV) is compared to a maximum allowed reverse current, IRV_max. If the reverse current IRV is less than the maximum allowed reverse current IRV_max, then the soft forming is recorded as successfully at step 826. The process then ends. Note that steps 822 and 824 are optional. In some embodiments diode damage is limited or absent and is detected by other test steps or not at all.

On the other hand, if the reverse current (IRV) is larger than the maximum allowed reverse current, IRV_max, this may indicate that the diode 204 is damaged. The process goes to step 820 where the memory cell 200 is flagged such that it is not used. The process then ends.

Note that in some embodiments, the difference between the forward current (IFV) after SET and RESET is a factor of more than 10. For example, the forward current (IFV) after SET may be about 500 nA, whereas the forward current after RESET may drop to about 40 nA. Note that the forward currents may depend on the amount of voltage that is used to read the memory cell. For example, reading with a higher voltage may increase the forward current (IFV). Also, it will be understood that the forward currents are presented for purposes of illustration.

Applying Bias Voltages to Bit Lines and Word Lines

Figure 9:
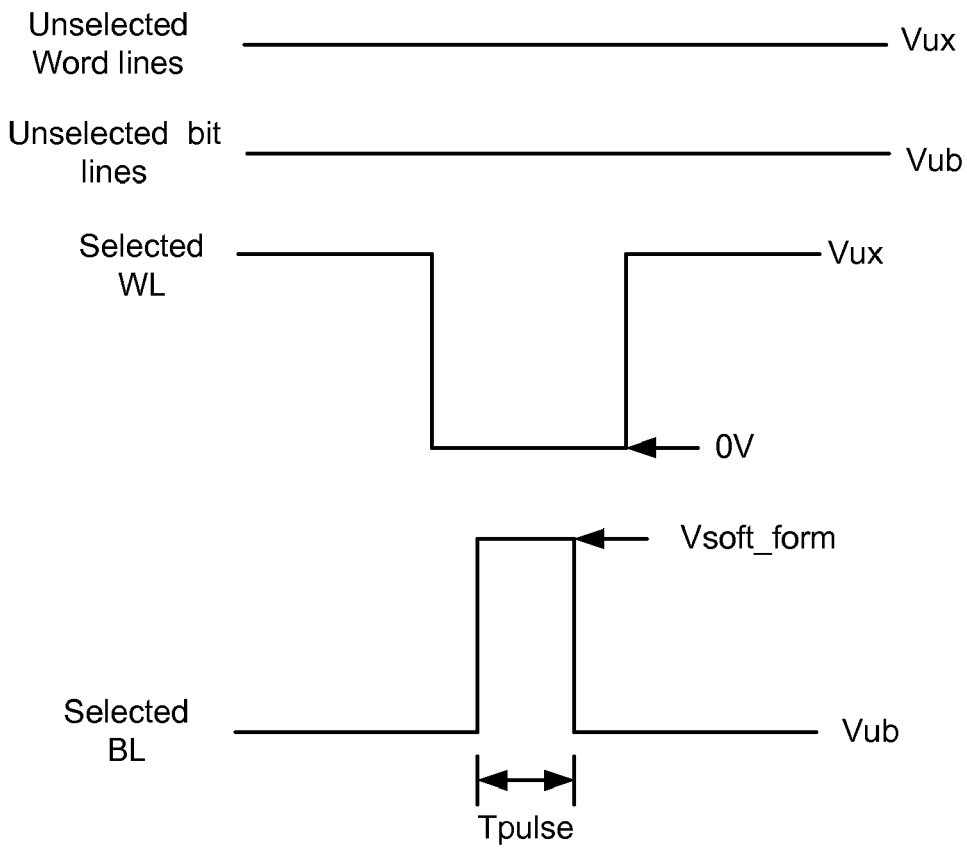
FIG. 9 depicts signals that are applied to a selected word line and a selected bit line when soft forming a memory element having a diode as a steering element.

The following describes additional details of applying bias voltages to bit lines and word lines for an embodiment in which the steering element 204 is a diode. FIG. 9 depicts example voltages applied to bias the word lines and bit lines during soft forming of the memory cell 200. The voltages may be applied during steps 607-608 of process 600 of FIG. 6. As depicted in FIG. 9, initially Vux may be applied to all word lines and Vub may be applied to all bit lines. The application of Vux to all word lines and Vub to all bit lines is one implementation of step 607 of FIG. 6. The voltages on the unselected word lines and unselected bit lines may remain relatively constant after they are initially established.

In contrast, the voltages on the selected word line and selected bit line is changed in order to apply Vform to the memory cell (step 608 of FIG. 6). In one embodiment, the bias to the selected word line changed from Vux to ground. After the voltage on the selected word line is at ground, the voltage on the selected bit line is raised from Vub to V_soft_form. The selected bit line is held at V_soft_form for a time period TPulse. An example range for Tpulse is between 0.1 microsecond and 10 microseconds. Then, the voltage on the selected bit line is dropped back to Vub (e.g., 0.5V). Finally, the voltage on the selected word line is raised back to Vux.

In embodiments in which the steering element is a p-i-n diode, Vux may be about 5.5V, Vub may be about 0.5V and V_soft_form may be about 6V. The diode may have a breakdown voltage of between about 5.5V and 6.5V, although the breakdown voltage could be higher or lower. In some embodiments in which the steering element 204 is a punch-thru diode, Vux may be about 5V, Vub may be about 3V and V_soft_form may be about 8V. Note that the values herein for Vux, Vub, and V_soft_form are examples and that other values could be used.

Figure 10A:
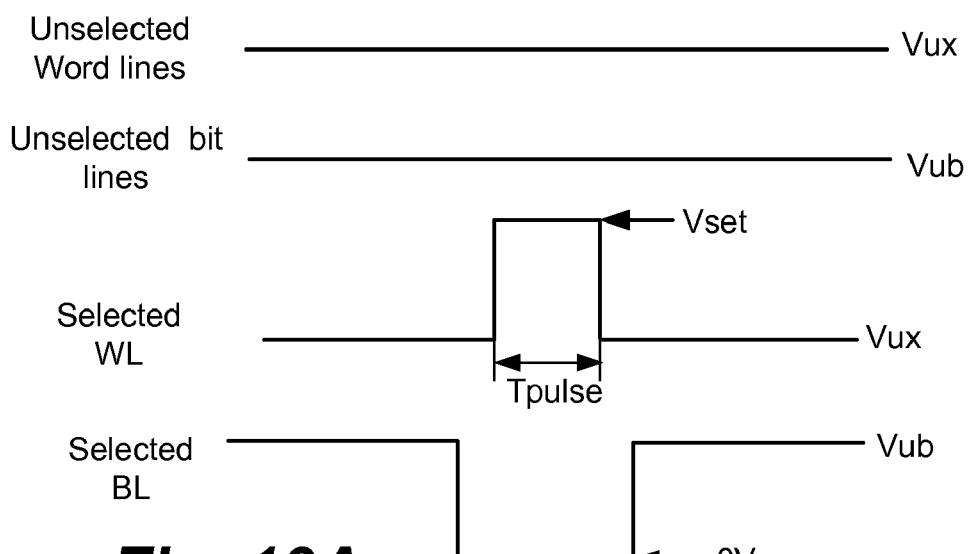
FIG. 10A depict signals that are applied to word lines and bit lines when SETTING a memory element.

FIG. 10A depicts waveforms that are applied to bit lines and word lines during a SET process. The waveforms illustrate additional details of steps 707 and 708 of FIG. 7. Recall that in step 707, bias voltages are applied to bit lines and word lines during the SET process. FIG. 10A depicts Vux applied to word lines and Vub applied to bit lines. The voltages on the unselected word lines and unselected bit lines may remain relatively constant after they are initially established.

After the voltages are established in step 707, recall that the SET voltage is applied in step 708. In one embodiment, the bias to the selected bit line is changed from Vub to ground and then the bias to the selected word line is changed from Vux to Vset in order to apply Vset. After holding the selected word line at Vset for a time period "Tpulse," the voltage on the selected word line is returned to Vux. The duration of Tpulse may be in the range of 10 nanoseconds to 500 nanoseconds. However, Tpulse may have a greater or shorter duration. Note that there is a "reverse voltage" across the memory cell 200 during Tpulse. This is referred to as a reverse voltage because the voltage goes lower on the selected bit line than the selected word line. In some embodiments, the reverse voltage causes a diode 204 in the memory cell 200 to be reversed biased. In one embodiment, the breakdown voltage of the diode is between 5.5 and 6.5 V. However, the breakdown voltage of the diode could be higher or lower. In embodiments in which the steering element is a p-i-n diode, Vux may be about 5V, Vub may be about 5V, and Vset may be about 10V. Note this means that the reverse voltage may be about 10V. In embodiments in which the steering element is a punch-thru diode, Vux may be about 3V, Vub may be about 5V, and Vset may be about 8V. Note this means that the reverse voltage may be about 8V. The reverse voltages for all cases are examples and could be higher or lower. Performing the partial forming (step 502, FIG. 4) prior to completing the forming (step 504, FIG. 4) may reduce the magnitude of the reverse voltage that is needed to complete the forming.

In one embodiment, the current is limited when applying the SET voltage. One technique to limit the current is referred to as a capacitive discharge method. For example, the selected bit line may be charged to the pulse voltage value and disconnected from the voltage source by a capacitive discharge method. Further details are described in U.S. patent application Ser. No. 12/339,313, filed in Dec. 19, 2008, titled "Reverse Set with Current Limit for Non-volatile Storage," which is hereby incorporated by reference in its entirety.

Figure 10B:
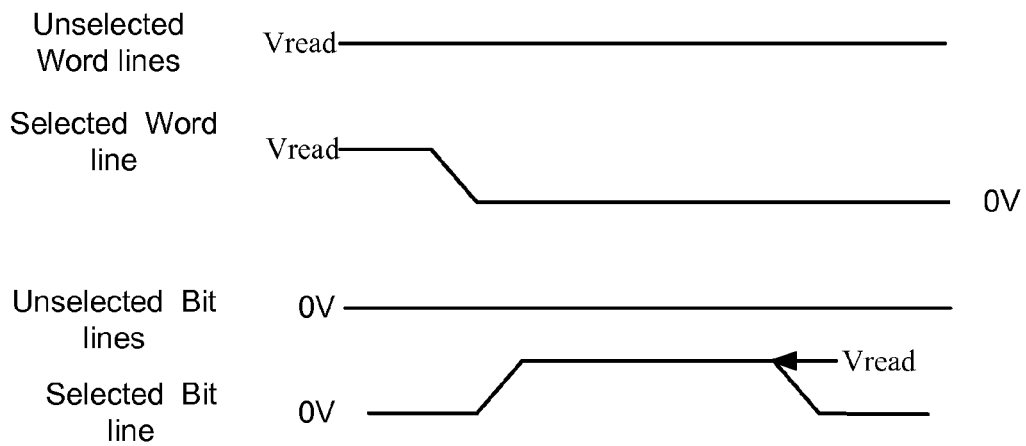
FIGS. 10B and 10C depicts signals that are applied to word lines and bit lines when sensing a memory element having a diode as a steering element.

FIG. 10B depicts example waveforms applied to bit lines and word lines when READING a memory cell 200. The waveforms provide further details for step 710 of FIG. 7 for an embodiment in which the steering element is a p-i-n diode. Initially Vread (e.g., 2V) is applied to the word lines and the bit lines are grounded. Next, the voltage to selected word line is dropped from Vread to ground. Then, the voltage to selected bit line is raised from ground to Vread. This results in the bias scheme depicted in FIG. 5D. The selected bit line may be held at Vread for about 1 microsecond. The current of the selected bit line may be sensed by a circuit such as FIG. 3. Then, the selected bit line is returned to ground.

Figure 10C:
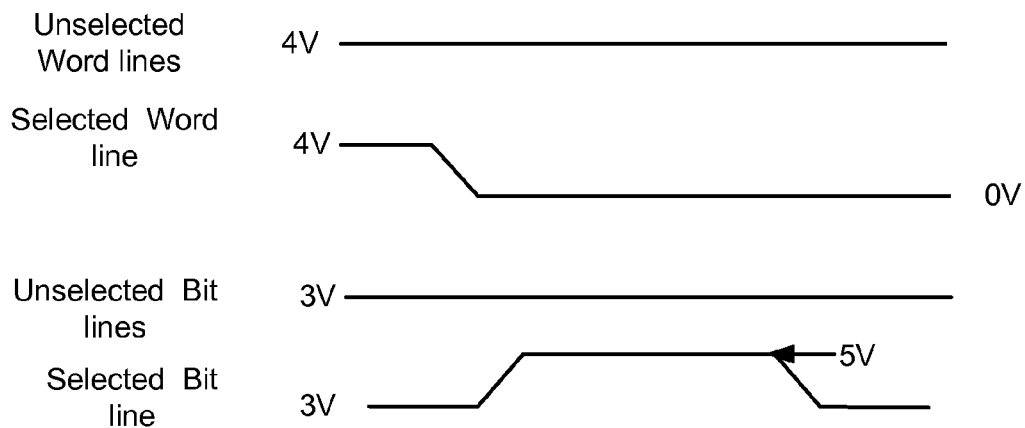

FIG. 10C shows waveforms that are applied in one embodiment when READING a memory cell 200 in which the steering element 204 is a punch-thru diode. This is one implementation of step 710 of FIG. 7. Initially 4V is applied to the word lines and 3V is applied to the bit lines. Next, the voltage to the selected word line is dropped from 4V to ground. Then, the voltage to selected bit line is raised from 3V to 5V. The selected bit line may be held at 5V for about 1 microsecond. The current of the selected bit line may be sensed when the voltage is at 5V. The current from the selected bit line may be sensed by a circuit such as FIG. 3. Then, the selected bit line is returned to 3V. Note that other voltages might be used for a punch-thru diode steering element.

Figure 10D:
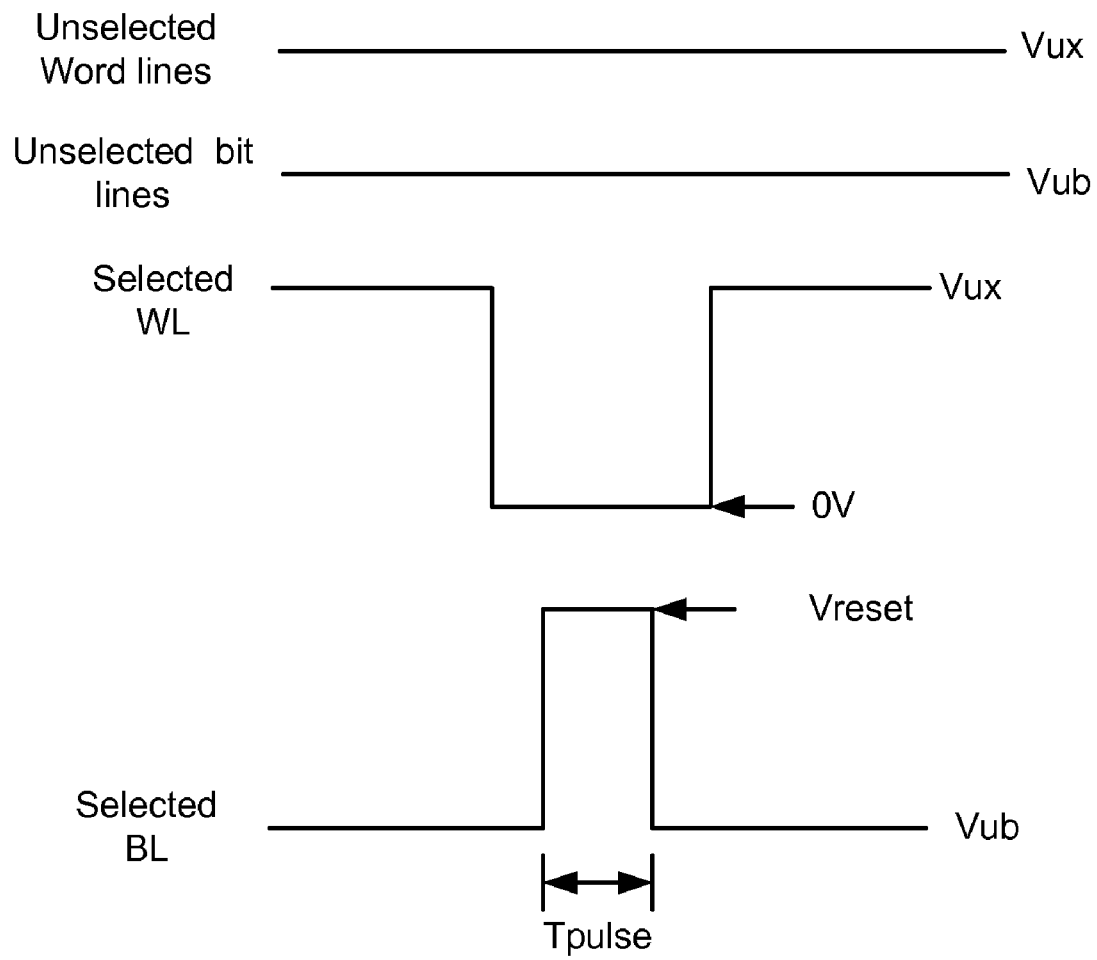
FIG. 10D depicts waveforms that are applied to bit lines and word lines during a RESET process.

FIG. 10D depicts waveforms that are applied to bit lines and word lines during a RESET process. The waveforms illustrate additional details of steps 807-808 of FIG. 8. Recall that in step 807, bias voltages are applied to bit lines and word lines during the RESET process. FIG. 10D depicts Vux initially applied to word lines and Vub initially applied to bit lines. The voltages on the unselected word lines and unselected bit lines may remain relatively constant after they are initially established.

After the voltages are established in step 807, recall that the RESET voltage is applied in step 808. In one embodiment, the bias to the selected word line is changed from Vux to ground and then the bias to the selected bit line is changed from Vub to Vreset in order to apply Vreset. After holding the selected bit line at Vreset for a time period "Tpulse," the voltage on the selected bit line is returned to Vub. The duration of Tpulse may be in the range of a few microseconds. However, Tpulse may have a greater or shorter duration. As an example, Vreset may be in the range from about 3.0V to about 5.0V. However, Vreset could be higher or lower. In one embodiment, Vux is about Vreset−0.7V. In one embodiment, Vub is about 0.7V.

In some embodiments, the steering element 204 is an FET. FIGS. 11A, 11B, and 11C, depict waveforms of voltages applied to a selected WL, a selected BL, and the gate of the FET during various operations. Reference will be made to the example memory array with FET steering elements 204 of FIG. 1E when discussing the example waveforms.

FIG. 11A depicts example waveforms that may be applied when soft forming a memory cell. Thus, FIG. 11A depicts waveforms for one implementation of steps 607-608 of process 600 of FIG. 6. Initially, all of the bit lines, word lines, and FET gates may be grounded. This is one implementation of step 607. The voltages to the unselected bit lines, the unselected word lines, and the unselected gate lines are not depicted in FIG. 11A, as they do not change. Next, the selected gate line is raised to a voltage Vgate that may have a magnitude that is selected to control the current through the selected memory cell 200. An example range of voltages is between 0.5V and 2.0V. However, Vgate could be higher or lower. Next, the voltage Vsoft_form is applied to the selected word line. An example, magnitude for Vsoft_form is 8V. The selected word line is held at Vsoft_form for a time period "Tpulse," which may range from 100 nanoseconds to 10 microseconds. However, Tpulse may be longer or shorter. After Tpulse, the selected word line is returned to ground. Then, the selected gate line is returned to ground. The application of Vgate and Vsoft_form are one implementation of step 608.

FIG. 11B depicts example waveforms that may be applied when SETTING a memory cell. The waveforms are one implementation of steps 707-708 of process 700 of FIG. 7. Reference will be made to the example memory array with FET steering elements 204 of FIG. 1E. Initially, all of the bit lines, word lines, and FET gates may be grounded. This is one implementation of step 707. The voltages to the unselected bit lines, the unselected word lines, and the unselected gate lines are not depicted in FIG. 11B, as they do not change. Next, the selected gate line is raised to a voltage Vgate that may have a magnitude that is selected to control the current through the selected memory cell 200. An example range of voltages is between 0.5V and 2.0V. However, Vgate could be higher or lower. Next, the voltage Vset is applied to the selected bit line. An example, magnitude for Vset is 8 V. The selected bit line is held at Vset for a time period "Tpulse," which may range from 10 nanoseconds to 500 nanoseconds. However, Tpulse may be longer or shorter. After Tpulse, the selected bit line is returned to ground. Then, the selected gate line is returned to ground. The application of Vgate and Vset are one implementation of step 708.

FIG. 11C depicts example waveforms that may be applied when reading a memory cell. This is one implementation of step 710 of FIG. 7. Initially, all of the bit lines, word lines, and FET gates may be grounded. The voltages to the unselected bit lines, the unselected word lines, and the unselected gate lines are not depicted in FIG. 11C, as they do not change. Next, the selected gate line is raised to a voltage Vgate that may have a magnitude that is selected to control the current through the selected memory cell 200. An example voltage for Vgate during a sense operation is 5V. However, Vgate could be higher or lower. Next, the voltage Vread is applied to the selected bit line. An example, magnitude for Vread is 2 V. The selected bit line is held at Vread for a time period "Tpulse," which may be about 1 micro-second. However, Tpulse may be longer or shorter. After Tpulse, the selected bit line is returned to ground. Then, the selected gate line is returned to ground.

One embodiment includes a method of operating non-volatile storage. The method comprises applying a first voltage to a memory cell having a reversible resistivity-switching memory element and applying a second voltage to the memory cell. Applying the first voltage reduces the resistance of the reversible resistivity-switching memory element. Applying the second voltage further reduces the resistance of the reversible resistivity-switching element. The second voltage has the opposite polarity as the first voltage.

One embodiment includes a storage system comprising a non-volatile memory cell including a reversible resistivity-switching memory element and one or more management circuits in communication with the memory cell. The more management circuits apply a first voltage to the memory cell to reduce the resistance of the reversible resistivity-switching memory element. The more management circuits apply a second voltage to the memory cell to further reduce the resistance of the reversible resistivity-switching element. The second voltage has the opposite polarity as the first voltage.

One embodiment includes a method of operating non-volatile storage. The method comprises applying one or more voltages having a first polarity to a memory cell having a reversible resistivity-switching memory element and a steering element in series with the reversible resistivity-switching memory element. Applying the one or more voltages having a first polarity reduces the resistance of the reversible resistivity-switching memory element to partially form the reversible resistivity-switching memory element. The method also includes applying one or more voltages having a second polarity to the memory cell to further reduce the resistance of the reversible resistivity-switching element to fully form the reversible resistivity-switching memory element. The second polarity is opposite the first polarity.

One embodiment includes a storage system, comprising a first plurality of conductors, a second plurality of conductor, and a plurality of non-volatile memory cells coupled between the first and second plurality of conductors in a cross-point array configuration. Each of the memory cells includes a reversible resistivity-switching memory element and a steering element. The storage system also includes one or more management circuits in communication with the memory cells. The one or more management circuits apply one or more voltages having a first polarity to a first of the memory cells to reduce the resistance of the reversible resistivity-switching memory element to partially form the reversible resistivity-switching memory element. The one or more management circuits apply one or more voltages having a second polarity to the first memory cell to further reduce the resistance of the reversible resistivity-switching element to fully form the reversible resistivity-switching memory element. The second polarity is opposite the first polarity.

The foregoing detailed description has been presented for purposes of illustration and description. It is not intended to be exhaustive or be limited to the precise form disclosed. Many modifications and variations are possible in light of the above teaching. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

What is claimed is:

1. A method of operating non-volatile storage, the method comprising:
    applying a first voltage to a memory cell having a reversible resistivity-switching memory element, applying the first voltage reduces the resistance of the reversible resistivity-switching memory element; and
    applying a second voltage to the memory cell, applying the second voltage further reduces the resistance of the reversible resistivity-switching element, the second voltage has the opposite polarity as the first voltage.

2. The method of claim 1, wherein applying the first voltage to the memory cell is performed in response to determining that an initial forming of the reversible resistivity-switching memory element should be performed.

3. The method of claim 1, further comprising applying a third voltage to the memory cell to increase the resistance of the resistivity-switching element after applying the second voltage, the third voltage has the same polarity as the first voltage, the third voltage is applied in response to determining that the memory cell should be RESET.

4. The method of claim 3, further comprising applying one or more voltages having the same polarity as the second voltage but no voltages having the same polarity as the first voltage to reduce the resistance of the memory cell, the one or more voltages having the same polarity as the second voltage are applied in response to determining that the memory cell should be SET.

5. The method of claim 1, further comprising:
    determining whether the resistance of the reversible resistivity-switching memory element has reached a target value after applying the second voltage; and
    applying one or more additional voltages to the memory cell until the resistance of the reversible resistivity-switching memory element reaches the target value, the one or more additional voltages have the same polarity as the second voltage.

6. The method of claim 1, further comprising:
    determining whether the resistance of the reversible resistivity-switching element has reached a target value after applying the first voltage; and
    applying one or more additional voltages to the reversible resistivity-switching element until the resistance of the reversible resistivity-switching element reaches the target value, the one or more additional voltages have the same polarity as the first voltage.

7. The method of claim 1, wherein the reversible resistivity-switching memory element includes a transition metal oxide.

8. The method of claim 1, wherein the memory cell includes a steering element.

9. The method of claim 8, wherein the steering element is a diode.

10. The method of claim 9, wherein the steering element is a Field Effect Transistor (FET).

11. The method of claim 1, further comprising limiting the current through the reversible resistivity-switching memory element when applying the first voltage to the memory cell.

12. The method of claim 1, further comprising limiting the current through the reversible resistivity-switching memory element when applying the second voltage to the memory cell.

13. The method of claim 1, wherein the memory cell is coupled to a bit line, the bit line is selectively coupled to a voltage source, the applying a second voltage to the memory cell includes:
    selectively coupling the voltage source to the bit line to charge the bit line using a pulse voltage from the voltage source; and
    disconnecting the bit line from the voltage source, the charge from the bit line reduces the resistance of the memory cell after disconnecting the bit line from the voltage source.

14. A storage system, comprising:
    a non-volatile memory cell including a reversible resistivity-switching memory element; and one or more management circuits in communication with the memory cell, the one or more management circuits apply a first voltage to the memory cell to reduce the resistance of the reversible resistivity-switching memory element, the one or more management circuits apply a second voltage to the memory cell to further reduce the resistance of the reversible resistivity-switching element, the second voltage has the opposite polarity as the first voltage.

15. The storage system of claim 14, wherein the one or more management circuits apply the first voltage to the memory cell in response to determining that an initial forming of the reversible resistivity-switching memory element should be performed.

16. The storage system of claim 14, wherein the one or more management circuits apply a third voltage to the memory cell to increase the resistance of the resistivity-switching element after applying the second voltage, the third voltage has the same polarity as the first voltage, the one or more management circuits apply third voltage in response to determining that the memory cell should be RESET.

17. The storage system of claim 16, wherein the one or more management circuits apply one or more voltages having the same polarity as the second voltage but no voltages having the same polarity as the first voltage to reduce the resistance of the memory cell, the one or more management circuits apply one or more voltages having the same polarity as the second voltage in response to determining that the memory cell should be SET.

18. The storage system of claim 14, wherein the one or more management circuits:
  determine whether the resistance of the reversible resistivity-switching memory element has reached a target value after applying the second voltage; and
  apply one or more additional voltages to the memory cell until the resistance of the reversible resistivity-switching memory element reaches the target value, the one or more additional voltages have the same polarity as the second voltage.

19. The storage system of claim 14, wherein the one or more management circuits:
  determine whether the resistance of the reversible resistivity-switching element has reached a target value after the one or more management circuits apply the first voltage; and
  apply one or more additional voltages to the reversible resistivity-switching element until the resistance of the reversible resistivity-switching element reaches the target value, the one or more additional voltages have the same polarity as the first voltage.

20. The storage system of claim 14, wherein the reversible resistivity-switching memory element includes a transition metal oxide.

21. The storage system of claim 14, wherein the memory cell includes a steering element.

22. The storage system of claim 21, wherein the steering element is a diode.

23. The storage system of claim 21, wherein the steering element is a Field Effect Transistor (FET).

24. The storage system of claim 14, further comprising a circuit that limits the current through the reversible resistivity-switching memory element when applying the first voltage to the memory cell.

25. The storage system of claim 14, further comprising a circuit that limits the current through the reversible resistivity-switching memory element when applying the second voltage to the memory cell.

26. The storage system of claim 14, further comprising a bit line coupled to the memory cell and a voltage source, the one or more managing circuits applying the second voltage to the memory cell includes the one or more managing circuits charging the bit line using a pulse voltage from the voltage source and disconnecting the bit line from the voltage source, charge from the bit line reduces the resistance of the memory cell after disconnecting the bit line from the voltage source.

27. The storage system of claim 14, further comprising:
  a first plurality of conductors;
  a second plurality of conductors; and
  a plurality of non-volatile memory cells coupled between the first and second plurality of conductors in a cross-point array configuration, each of the memory cells includes a reversible resistivity-switching memory element and a steering element;
  the one or more management circuits are in communication with the plurality of non-volatile memory cells, the one or more management circuits apply a first voltage to a selected memory cell of the memory cells to reduce the resistance of the reversible resistivity-switching memory element of the selected memory cell, the one or more management circuits apply a second voltage to the selected memory cell to further reduce the resistance of the reversible resistivity-switching element of the selected memory cell, the second voltage has the opposite polarity as the first voltage.

28. A method of operating non-volatile storage, the method comprising:
  applying one or more voltages having a first polarity to a memory cell having a reversible resistivity-switching memory element and a steering element in series with the reversible resistivity-switching memory element, applying the one or more voltages having a first polarity reduces the resistance of the reversible resistivity-switching memory element to partially form the reversible resistivity-switching memory element; and
  applying one or more voltages having a second polarity to the memory cell to further reduce the resistance of the reversible resistivity-switching element to fully form the reversible resistivity-switching memory element, the second polarity is opposite the first polarity.

29. The method of operating non-volatile storage of claim 28, further comprising applying one or more voltages having the first polarity to the memory cell to increase the resistance of the reversible resistivity-switching element to RESET the reversible resistivity-switching element after fully forming the reversible resistivity-switching element.

30. A storage system, comprising:
  a first plurality of conductors;
  a second plurality of conductors;
  a plurality of non-volatile memory cells coupled between the first and second plurality of conductors in a cross-point array configuration, each of the memory cells includes a reversible resistivity-switching memory element and a steering element; and
  one or more management circuits in communication with the memory cells, the one or more management circuits apply one or more voltages having a first polarity to a first of the memory cells to reduce the resistance of the reversible resistivity-switching memory element to partially form the reversible resistivity-switching memory element, the one or more management circuits apply one or more voltages having a second polarity to the first memory cell to further reduce the resistance of the reversible resistivity-switching element to fully form the reversible resistivity-switching memory element, the second polarity is opposite the first polarity.

* * * * *